(12) United States Patent
Iida et al.

(10) Patent No.: US 6,385,690 B1
(45) Date of Patent: May 7, 2002

(54) RECORDING METHOD, MANAGING METHOD, AND RECORDING APPARATUS

(75) Inventors: Kenichi Iida, Saitama; Eiichi Yamada, Tokyo; Shuji Ohbayashi, Saitama, all of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/513,482

(22) Filed: Feb. 25, 2000

(30) Foreign Application Priority Data

Feb. 26, 1999 (JP) .......................................... 11-051270

(51) Int. Cl.$^7$ ............................................. G06F 12/00
(52) U.S. Cl. ............................. 711/103; 711/4; 711/112; 707/200; 707/205
(58) Field of Search ............................. 711/4, 112, 103; 707/200, 205

(56) References Cited

U.S. PATENT DOCUMENTS

| | | | |
|---|---|---|---|
| 5,493,676 A | 2/1996 | Amundson | 395/183.18 |
| 5,585,845 A | 12/1996 | Kawamura et al. | 348/231 |
| 5,867,466 A | 2/1999 | Igarashi et al. | 369/58 |
| 6,189,081 B1 * | 2/2001 | Fujio | 711/171 |

FOREIGN PATENT DOCUMENTS

| | | | |
|---|---|---|---|
| EP | 0333165 | 9/1989 | G11B/27/10 |
| EP | 0977121 | 2/2000 | G06F/12/02 |

OTHER PUBLICATIONS

Meyer, C., "It's not a Trick—It's a Stick," CT Magazin Fuer Computer Technik, Verlag Heinz Heise GMBH., Hannover, No. 6, Mar. 15, 1999, pp. 90–91.

* cited by examiner

Primary Examiner—Do Hyun Yoo
Assistant Examiner—Mehdi Namazi
(74) Attorney, Agent, or Firm—Jay H. Maioli

(57) ABSTRACT

A recording method and apparatus for recording data that is continuously input in a nonvolatile memory records the data discretely in a plurality of blocks under control of file management data, is capable of high speed data recording by only recording data in a recording medium during data recording and updating of file management data at a time after completion of data recording.

21 Claims, 30 Drawing Sheets

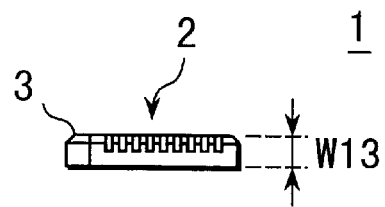
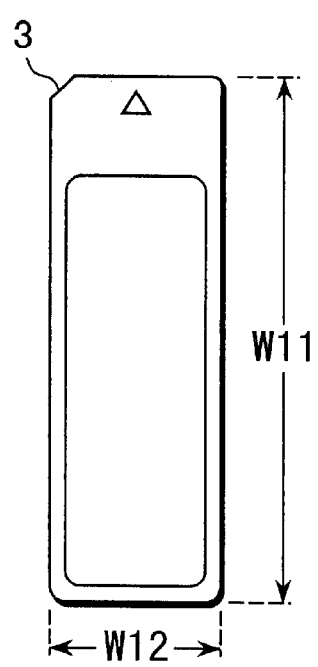
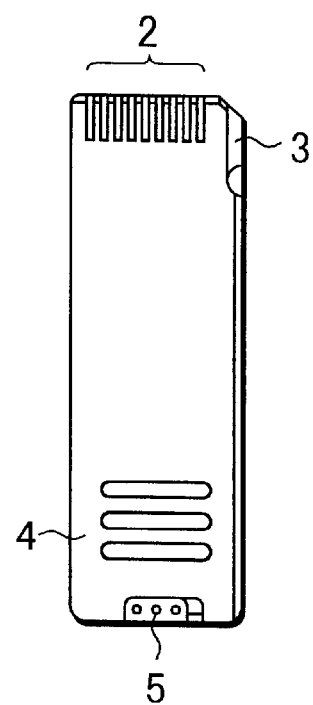

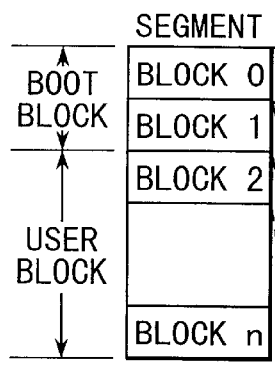
FIG. 3A
SEGMENT
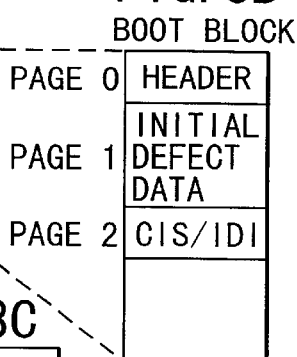
FIG. 3B
BOOT BLOCK
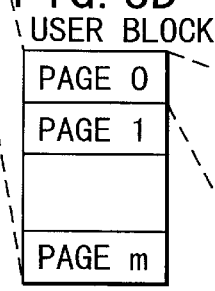
FIG. 3C
FIG. 3D
USER BLOCK
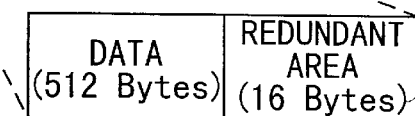
FIG. 3E
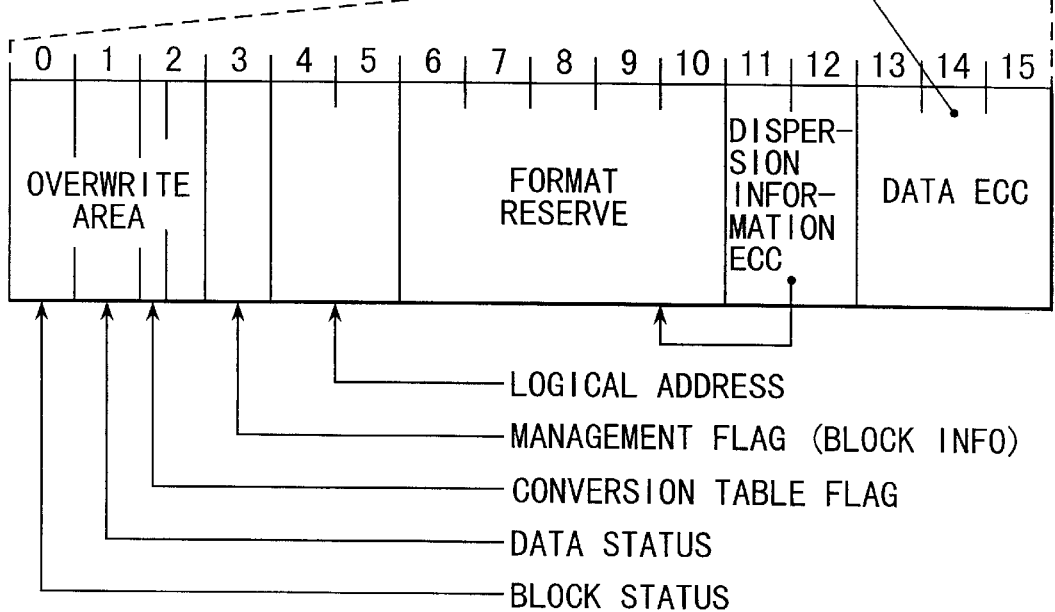
FIG. 3F

FIG. 4

MANAGEMENT FLAG

| BIT | DEFINITION |
|---|---|
| 7 | RESERVED |
| 6 | RESERVED |
| 5 | ACCESS PERMISSION (1:FREE 0:READ PROTECTED) |
| 4 | COPY INHIBITION SPECIFICATION (1:OK 0:NG) |
| 3 | CONVERSION TABLE FLAG (1:INEFFECTIVE, 0:TABLE BLOCK) ONLY LAST SEGMENT IS EFFECTIVE |
| 2 | SYSTEM FLAG (1:USER BLOCK, 0:BOOT BLOCK) |
| 1 | RESERVED |
| 0 | RESERVED |

BEFORE DATA UPDATING PROCESS

AFTER DATA UPDATING PROCESS

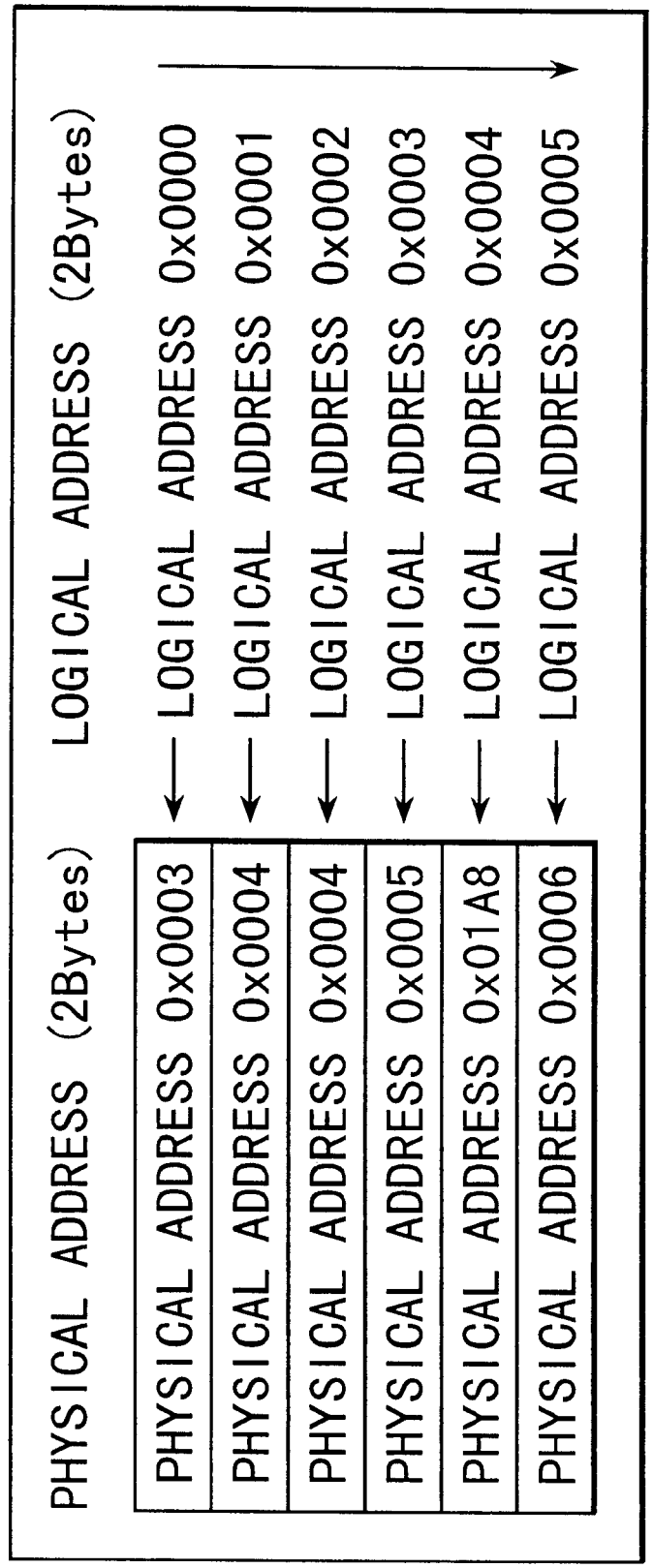

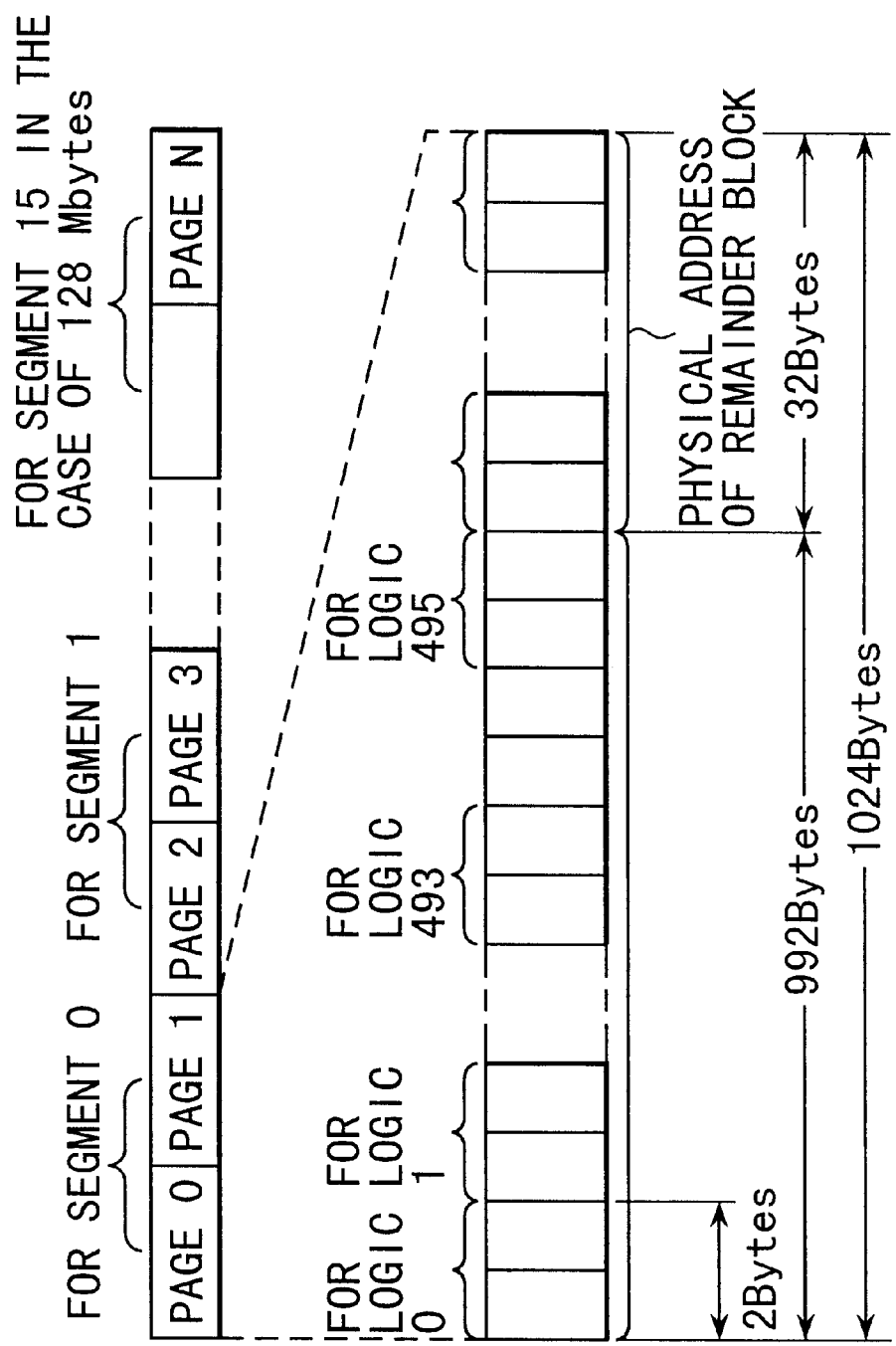

FIG. 8A PRESENT EXAMPLE

| LOGICAL ADDRESS | 0×0000 | 0×0001 | 0×0002 | 0×0003 | 0×0004 | 0×0005 |
|---|---|---|---|---|---|---|
| PHYSICAL ADDRESS | 0×0002 | 0×0006 | 0×0007 | 0×0008 | 0×0009 | |

USED ←→ UNUSED

FIG. 8B RELATED ART

| LOGICAL ADDRESS | 0×0000 | 0×0001 | 0×0002 | 0×0003 | 0×0004 | 0×0005 |
|---|---|---|---|---|---|---|
| PHYSICAL ADDRESS | 0×0002 | 0×0006 | 0×0007 | 0×0008 | 0×FFFF | |

USED ←→ UNUSED

FIG. 9

| FLASH MEMORY CAPACITY | NUMBER OF BLOCKS | CAPACITY OF 1 BLOCK | CAPACITY OF 1 PAGE | LOGICAL/PHYSICAL ADDRESS CONVERSION TABLE SIZE |
|---|---|---|---|---|
| 4MB | 512 (1 SEGMENT) | 8KB (16PAGES) | (512+16)B | 1KB (2PAGES) |
| 8MB | 1024 (2 SEGMENTS) | 8KB (16PAGES) | (512+16)B | 2KB (4PAGES) |
| 16MB | 2048 (4 SEGMENTS) | 8KB (16PAGES) | (512+16)B | 4KB (8PAGES) |
| | 1024 (2 SEGMENTS) | 16KB (32PAGES) | (512+16)B | 2KB (4PAGES) |
| 32MB | 2048 (4 SEGMENTS) | 16KB (32PAGES) | (512+16)B | 4KB (8PAGES) |
| 64MB | 4096 (8 SEGMENTS) | 16KB (32PAGES) | (512+16)B | 8KB (16PAGES) |
| 128MB | 8192 (16 SEGMENTS) | 16KB (32PAGES) | (512+16)B | 16KB (32PAGES) |

FIG. 14

STRUCTURE OF DIRECTORY FOR 1 FILE NAME, ( ) : NUMBER OF Bytes

| FILE NAME (8) | EXTENSION (3) | ATTRIBUTE (1) | RESERVE (10) | TIME (2) | DATE (2) | FIRST CLUSTER (2) | SIZE (4) |
|---|---|---|---|---|---|---|---|

FIG. 19

FAT BEFORE RECORDING    ( ) : CORRESPONDING CLUSTER NUMBER, VALUE IS HEXADECIMAL EXPRESSION

| (0) 009 | (1) — | (2) 003 | (3) 004 | (4) 006 | (5) 000 | (6) 008 | (7) 000 |
|---|---|---|---|---|---|---|---|
| (8) 009 | (9) FFF | (A) 000 | (B) 000 | (C) 000 | (D) 000 | (E) 000 | (F) 000 |
| (10) 000 | (11) 000 | (12) 000 | (13) 000 | (14) 000 | (15) 000 | (16) 000 | (17) 000 |
| (18) 000 | (19) 000 | (1A) 000 | (1B) 000 | (1C) 000 | (1D) 000 | (1E) 000 | (1F) 000 |
| ⋯ | ⋯ | ⋯ | ⋯ | | | | |
| (CLmax-7) 000 | (CLmax-6) 000 | (CLmax-5) 000 | (CLmax-4) 000 | (CLmax-3) 000 | (CLmax-2) 000 | (CLmax-1) 000 | (CLmax) 000 |

FIG. 20

FAT AFTER RECORDING     ( ): CORRESPONDING CLUSTER NUMBER, VALUE IS HEXADECIMAL EXPRESSION

| (0) | (1) | (2) | (3) | (4) | (5) | (6) | (7) |
|---|---|---|---|---|---|---|---|
| FFF | 009 | 003 | 004 | 006 | 007 | 008 | 00A |
| (8) | (9) | (A) | (B) | (C) | (D) | (E) | (F) |
| 009 | FFF | 00B | 00C | 00D | 00E | FFF | 000 |
| (10) | (11) | (12) | (13) | (14) | (15) | (16) | (17) |
| 000 | 000 | 000 | 000 | 000 | 000 | 000 | 000 |
| (18) | (19) | (1A) | (1B) | (1C) | (1D) | (1E) | (1F) |
| 000 | 000 | 000 | 000 | 000 | 000 | 000 | 000 |
| (CLmax−7) | (CLmax−6) | (CLmax−5) | (CLmax−4) | (CLmax−3) | (CLmax−2) | (CLmax−1) | (CLmax) |
| 000 | 000 | 000 | 000 | 000 | 000 | 000 | 000 |

RECORDING METHOD, MANAGING METHOD, AND RECORDING APPARATUS

FIELD OF THE INVENTION

This invention relates to a recording method, a managing method, and a recording apparatus capable of high-speed data recording by only recording data in a recording medium during data recording and updating file management data collectively after the end of data recording in the recording apparatus to record data to be inputted continuously in the non-volatile memory that is managed according to file management data and is discretely recordable in the plural blocks.

BACKGROUND OF THE INVENTION

A small-sized recording medium having a solid memory element such as flash memory is formed, it is incorporated in a driving apparatus, which is exclusively used for such solid memory element, as a built-in memory, or the driving apparatus is incorporated in an audio/video apparatus or information apparatus as a built-in driving apparatus. Such apparatus described herein above used for storing the computer data, stationary image data, moving picture data, and audio data has been developed recently.

In a recording system which utilizes such solid memory element, because the content of the moving picture data, and audio data is temporally continuous intrinsically, when so-called stream data which is being continuously supplied is recorded as the recording data, in some cases the data is not recorded properly because of unconformable relation between the recordable data quantity per unit time and the bit rate of the stream data.

In other words, in the case that the bit rate, data quantity per unit time, of the stream data supplied continuously exceeds the bit rate of the recordable data quantity, the stream data overflows. The bit rate of recordable stream data is therefore resultantly restricted. Further in other words, the stream data having the bit rate higher than a predetermined value cannot be recorded in real time.

The data writing process performed by a system which manages the address of written data by means of FAT (File Allocation Table) in a recording medium having a flash memory and uses the address conversion table is shown in FIG. 22.

Though FAT and the address conversion table will be described in detail hereinafter, FAT is the information for managing the concatenation of clusters as a file by linking the address when the data is written in a predetermined data unit, cluster described hereinafter, one by one.

The address conversion table is the information for converting the logical address to be used for FAT to the physical address namely the real address on an actual recording medium.

In detail, one file data is recorded usually on a recording medium over a plurality of clusters, at that time FAT records the concatenation of clusters to manage the record as one data file, address and order of clusters. FAT performs a process by means of address corresponding to the data as the logical address, the address is converted to the physical address based on the address conversion table and the recording/reproducing access to the recording medium is performed.

In the case that the stream data is recorded, the controller of a recorder opens a file to start recording operation in step F301 as shown in FIG. 22.

Every time when one-cluster data is taken in as the supplied stream data, one-cluster data is written in the recording medium in step F302, and the address conversion table and FAT are updated concomitantly with writing of the cluster in steps F303 and F304. In other words, FAT and address conversion table in the recording medium are rewritten.

The reason for requiring updating the FAT and the address conversion table is that an unused logical address on the FAT is assigned and used to write cluster data, a physical address corresponding to the logical address is used on the recording medium. In other words, a certain unused area on the FAT is assigned corresponding to the record of one cluster, and an unused physical address is assigned on the address conversion table corresponding to the logical address.

Every time when 1 cluster stream data is taken in, the steps F302 to F304 are repeated, and when recording of all the stream data supplied as the recording data is completed, then the sequence proceeds to steps F305 to F306, and the file is closed and the process is brought to an end.

The process as described herein above is performed, in this case, it is required that the update data of FAT and the update data of the address conversion table are written every time when 1 cluster data is written. In other words, the writable quantity of stream data is about ⅓ of the writable data quantity per unit time because it is required to write the data in the ratio of the management data update data quantity of 2 to the stream data quantity of 1.

The situation that the stream data having a bit rate exceeding the writable data quantity per unit time can not be accommodated is accepted with reluctance because the writable data quantity per unit time in a recording medium is determined by the specification of the system hardware, but it is not preferable that the upper limit far lower than the upper limit due to the specification of the hardware, namely about ⅓ of writable data quantity per unit time, is caused.

In relation to the above-mentioned problem, it has been desired to eliminate the problem that the high bit rate stream data is accommodable in the view point of the hardware but cannot be accommodated due to the restriction associated with the software. In other words, it is desirable that the high bit rate stream data is writable up to the high bit rate determined by the specification of the hardware as high as possible.

SUMMARY OF THE INVENTION

It is an object of the present invention to provide a recording method for recording continuously inputted main data in the blocks of a discretely writable recording medium, to which the identification numbers are added, managed by the recording management data having the writing start locations of main data and the link data for logically linking discretely recorded main data, comprising the steps of:

retrieving recordable blocks in the recording medium in a predetermined order;

recording the main data in the recordable blocks; and recording the link data in the recording management data area after completion of recording the main data in the recording area.

It is another object of the present invention to provide a managing method for managing the recording management data having the writing start locations of main data continuously inputted and recorded in the discretely recordable recording medium having a plurality of blocks managed with identification numbers which are added to the blocks and the link data for logically linking discretely recorded main data, comprising the steps of:

retrieving recordable blocks according to the recording management data in a predetermined order using identification numbers which are added to the blocks;

recording the recording start location and the link data for logically linking discretely recorded main data as the recording management data wherein the identification number of the block for which the main data is retrieved first is specified to be a writing start location when main data is already recorded in the retrieved blocks.

It is another object of the present invention to provide a recording apparatus for recording continuously inputted main data in the blocks of a discretely writable recording medium, to which the identification numbers are added, managed by the recording management data having the writing start locations of main data and the link data for logically linking discretely recorded main data, comprising:

retrieving means for retrieving recordable blocks of the recording medium in a predetermined order;

recording means for recording the main data and the recording management data in the recording medium; and control means for retrieving recordable blocks by the retrieving means, recording the main data in the retrieved recordable blocks in the recording medium by the recording means, recording the link data created on completion of recording and writing start locations together as recording management data in the recording medium by the recording means.

BRIEF DESCRIPTION OF THE DRAWINGS

FIG. 1A is a front view of the stick memory of an embodiment of the present invention;

FIG. 1B is a side view of the stick memory of an embodiment of the present invention;

FIG. 1C is a plan view of the stick memory of an embodiment of the present invention;

FIG. 1D is a bottom view of the stick memory of an embodiment of the present invention;

FIG. 3A explains a segment in the physical data structure of the stick memory of the present embodiment;

FIG. 3B explains a boot block in the physical data structure of the stick memory of the present embodiment;

FIG. 3C explains a backup boot block in the physical data structure of the stick memory of the present embodiment;

FIG. 3D explains a user block in the physical data structure of the stick memory of the present embodiment;

FIG. 3E explains a page in the physical data structure of the stick memory of the present embodiment;

FIG. 3F explains a redundant area in the physical data structure of the stick memory of the present embodiment;

FIG. 4 explains the contents of a management flag of the stick memory of the present embodiment;

FIG. 6 illustrates the management format of the logical-physical address conversion table of the present embodiment;

FIG. 7A illustrates the structure of the logical-physical address conversion table of the present embodiment;

FIG. 7B illustrates a segment the structure of the logical-physical address conversion table of the present embodiment;

FIG. 8A illustrates the management format of an unused block in the logical-physical address conversion table of the embodiment of the present invention;

FIG. 8B illustrates the management format of an unused block in the logical-physical address conversion table of the related art;

FIG. 9 is a table showing the relationship between flash memory capacity, number of blocks, capacity of one block, capacity of one page, size of logical-physical address conversion table in the stick memory of the present embodiment;

FIG. 14 illustrates the contents of a directory;

FIG. 19 illustrates the FAT before high speed writing process of the present embodiment;

FIG. 20 illustrates the FAT after high speed writing process of the present embodiment;

DETAILED DESCRIPTION OF THE PREFERRED EMBODIMENTS

Figure 2:
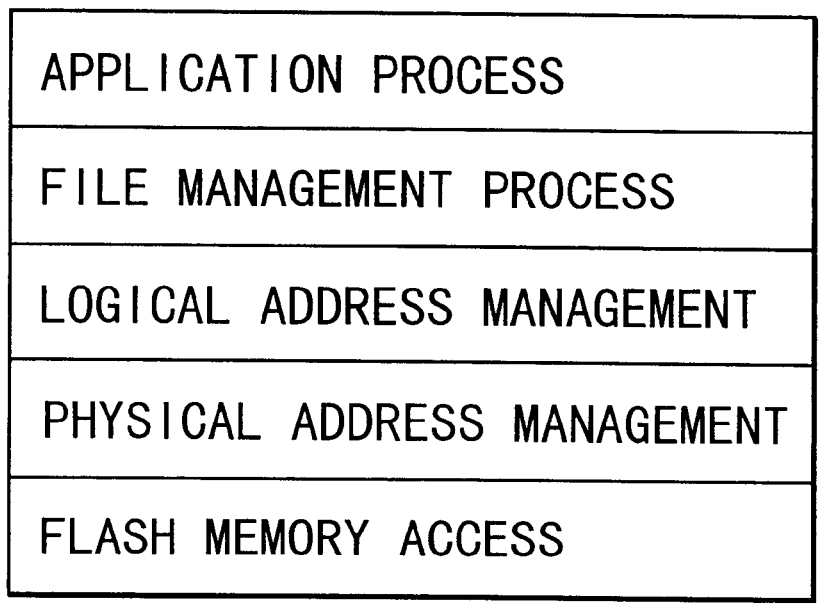
FIG. 2 explains file system process layers of the present embodiment.

An embodiment of the present invention will be described hereinafter. In this embodiment, a driving apparatus and a recording method that uses the driving apparatus, which are used for recording/reproducing the data in a stick memory having plate like appearance used as an exemplary recording medium, are described.

The embodiment will be described in the order described herein under.

1. Apparent Configuration of a Stick Memory
2. Format of a Stick Memory
2-1. Memory File System Process Layered Structure
2-2. Physical Data Structure
2-3 Concept of Physical Address and Logical Address
2-4 Logic-physical Address Conversion Table
3. Structure of Driving Apparatus
4. FAT Structure
5. Writing Process of Steam Data
6. Resuming Process 1. Apparent Configuration of Stick Memory First, the apparent configuration of a stick memory 1 namely the recording medium used in the present invention is described with reference to FIGS. 1A to 1D. The stick memory 1 is provided with a memory element having, for example, a predetermined capacity in a plate-like box as shown in FIGS. 1A to 1D. In this example, a flash memory is used as the memory element.

A plan view (FIG. 1C), front view (FIG. 1A), side view (FIG. 1B), and bottom view (FIG. 1D) of the box are shown, and the box is formed of, for example, a plastic mold, detailed exemplary sizes of widths W11, W12, W13 shown in FIG. 1C are W11=60 mm, W12=20 mm, and W13=2.8 mm respectively.

A terminal 2 having, for example, 9 electrodes is formed on the portion from under-front to the bottom side of the box, the date is read out from or written in the internal memory element by way of the terminal 2. The upper-left portion of the box in the plane direction is cut to form a cut 3. The cut 3 is served to prevent erroneous insertion of the stick memory 1 in the erroneous direction, for example, when the stick memory 1 is inserted to an attaching/detaching mechanism of the driving apparatus body side.

A rough portion 4 served to prevent sliding for improving the usability is formed on the bottom side of the box.

Furthermore, a slide switch 5 served for preventing erroneous erasing of the memory content is formed.

2. Format of Stick Memory 2-1. Memory File System Process Layered Structure

Next, format in the system using the stick memory 1 as the recording medium is described.

FIG. 2 shows a file system process layered structure of the system that uses the stick memory 1 as the recording medium.

As shown in FIG. 2, in the file system process layered structure, file management process layer, logical address layer, physical address layer, and flash memory access are structured successively under the application process layer.

In this layered structure, the file management process layer is relevant to the so-called FAT (File Allocation Table).

As understood from FIG. 2, in the file system of the present example, the concept of the logical address and physical address is introduced, and the concept will be described hereinafter.

2-2 Physical Data Structure

FIGS. 3A to 3F show a physical data structure of the flash memory namely the memory element in the stick memory 1.

The memory area served as the flash memory is divided into fixed length data unit referred to as segment. The segment has a size specified as 4 MB (megabyte) or 8 MB per 1 segment, and the number of segments in 1 flash memory is different depending on the capacity of the flash memory.

As shown in FIG. 3A, 1 segment is divided into fixed length data unit referred to as block. The data unit is specified as 8 KB or 16 KD. As a rule, 1 segment is divided into 512 blocks, then for the block n shown in FIG. 3A, n=511. However, in the case of the flash memory, because the number of blocks served as the defect area (write-inhibited damage area) is allowed in a range of prescribed number, in the case that the number of real blocks which is effective for data writing is targeted, the above-mentioned n is less than 511.

The head two blocks 0 and 1 out of the blocks 0 to n formed as shown in FIG. 3A is called as the boot block, and the boot block is not necessarily the blocks 0 and 1.

Residual blocks are the user block in which the user data is to be stored.

1 block is divided into pages 0 to m as shown in FIG. 3D. The capacity of 1 page is a fixed length of 528 (=512+16) bytes consisting of 512 byte data area and 16 byte redundant area as shown in FIG. 3E. The structure of the redundant area will be described hereinafter with reference to FIG. 3F.

The number of pages in 1 block is 16 pages in the case of 1 block capacity of 8 KB and is 32 pages in the case of 1 block capacity of 16 KB.

The page structure in the block shown in FIGS. 3D and 3E as described herein above is common for the above-mentioned boot block and user block.

In the flash memory, the data is read and written in page unit, and the data is erased in block unit. The data is written only in the erased page. Accordingly, actual reading/writing of the data is performed in block unit.

As shown in FIG. 3B, a header is stored in the page 0, and the information in the location indicated by the address of an initial defective data is stored in the page 1. Furthermore, the information referred to as SIS/IDS is stored in the page 2.

The second boot block is an area for backup as the boot block as shown in FIG. 3C.

16 bytes of the redundant area shown in FIG. 3E has the structure shown in FIG. 3F. In the redundant area, the head 3 bytes from the 0-th byte to second byte are the overwrite area which is rewritable correspondingly to update of the data content of the data area. Out of the overwrite area, the block status is stored in the 0-th byte, and the block flag data (data status) is stored in the first byte. The page data status 1 as a conversion table flag is stored by use of an upper predetermined bit of the second byte.

As a rule, bytes from the third byte to 15-th byte are defined as the area where the information having the content that is fixed depending on the data content of the current page and which is not rewritable. Block Info as the management flag is stored in the third byte, and the logical address described hereinafter is stored in the 2-byte area consisting of the fourth byte and fifth byte.

The area consisting of 5 bytes from the sixth byte to the 10-th byte is defined as the format reserve area, and the area consisting of subsequent 2 bytes consisting of the 11-th byte and 12-th byte is defined as the area where distributed information ECC for correcting an error of the above-mentioned format reserve is stored.

In the residual bytes from the 13-th byte to 15-th byte, the data ECC for correcting an error of the data of the data area shown in FIG. 3E is stored.

The content of the management flag stored in the third byte of the redundant area shown in FIG. 3F is defined in the bits from the bit 7 to bit 0 as shown in FIG. 4.

Bits 7 and 6 and bits 1 and 0 are defined as the reserve (undefined).

A flag for indicating being effective (1: Free) or being non-effective (0: Read Protected) of access permission to the current block is stored in the bit 5. A flag for indicating copy inhibition (1: OK, 0: NG) of the current block is stored in the bit 4.

The bit 3 is defined as the conversion table flag. The conversion table flag is an identifier for indicating whether the current block is a logical-physical address conversion table described hereinafter or not, if the value of the bit 3 is 1, then the current block is identified as a logical-physical address conversion table, on the other hand if the value of the bit 3 is 0, then the current block is identified as non-effective. In detail, the current block is identified as not a logical-physical address conversion table.

In the bit 2, a system flag is stored, 1 indicates that the current block is a user block, and 0 indicates that the current block is a boot block.

The relation between the segment and block and the flash memory capacity is described with reference to FIG. 9. The flash memory capacity of the stick memory 1 is specified as any one of 4 MB, 8 MB, 16 MB, 32 MB, 64 MB, and 128 MB.

In the case of 4 MB, which is the smallest capacity, 1 block is specified as 8 KB and the number of blocks is 512. In other words, 4 MB has just 1 segment capacity. In the case of 8 MB capacity, 1 block is specified similarly as 8 KB capacity and the number of blocks is 2 segments=1024. As described herein above, if 1 block=8 KB, then the number of pages in a block is 16. In the case of 16 MB capacity, both 8 KB and 16 KB may be mixed. Accordingly, two types namely 2048 blocks=4 segments (1 block=8 KB) and 1024 blocks=2 segments (1 block=16 KB) may be possible. In the case of 1 block=16 KB, the number of pages in 1 block is 32.

In the case of 32 MB, 64 MB, and 128 MB capacity, the capacity per 1 block is specified as only 16 KB. Accordingly, in the case of 32 MB capacity, 1 block is specified as 2048 blocks=4 segments, in the case of 64 MB capacity, 1 block is specified as 4096 blocks=8 segments, and in the case of 128 MB capacity, 1 block is specified as 8192 blocks=16 segments.

2-3. Concept of Physical Address and Logical Address

Next, based on the physical data structure of the flash memory as described herein above, the concept of the physical address and logical address in the file system of the present example is described according to the data rewriting operation shown in FIGS. 5A and 5B.

Figure 5A:
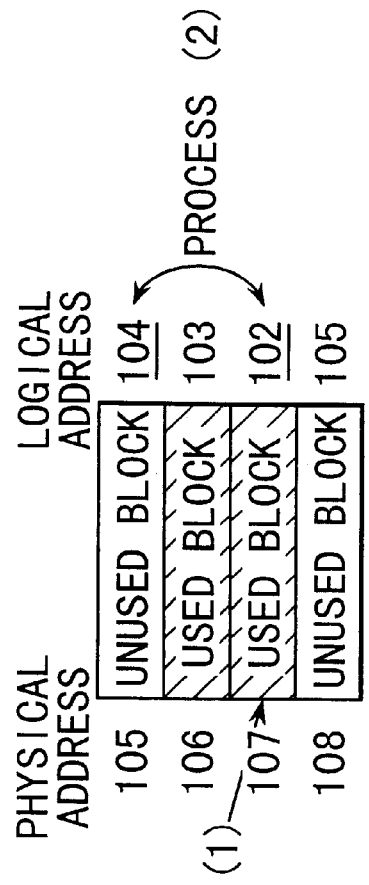
FIG. 5A is a drawing illustrating the status of the stick memory blocks before data updating processes among drawings illustrating the concept of updating processes and physical and logical addresses in the stick memory of the present embodiment.

FIG. 5A shows a schematic diagram of four blocks selected from among a certain segment.

A physical address is assigned to each block. The physical address is determined according to the physical arrangement order of blocks in the memory, and the relation between a certain block and the corresponding physical address is permanent. Herein, the physical address values 105, 106, 107 and 108 are assigned to the four blocks shown in FIG. 5A from the top. The real physical address is represented by 2 bytes.

As shown in FIG. 5A, it is assumed that blocks represented by the physical addresses 105 and 106 are the used block where the data is stored and blocks represented by the physical addresses 107 and 108 are the unused block where the data is erased, in other words, unrecorded area.

The logical address is the address allocated concomitantly with the data written in the block. The logical address is the address that is used in FAT file system described hereinafter.

In FIG. 5A, logical address values 102, 103, 104, and 105 are assigned to four blocks from the top. The logical address is also represented by 2 bytes.

It is assumed that the data stored in, for example, the physical address 105 is updated from the status shown in FIG. 5A and the content is partially rewritten or erased.

In this case, in the file system of the flash memory, the update data is not written in the same block again but the update data is written in the unused block. In detail, for example as shown in FIG. 5B, the data in the physical address 105 is erased and the update data is written in the block that is represented by the physical address 107, which has been unused until that time (process ①).

As shown in process ②, the logical address is changed so that the logical address 102 corresponding to the physical address 105 in the status before data update in FIG. 5A corresponds to the physical address 107 of the block where the update data is written. Concomitantly with the above-mentioned process, the logical address 104 corresponding to the physical address 107 before data update is changed so as to correspond to the physical address 105.

In detail, the physical address is the address that is assigned inherently to the block, and the logical address is the address that is concomitant with the data written once in the block and is inherent to the block unit written data.

As the result of the swap process of the block, a certain same memory area (block) does not receive concentratedly the access, and it is possible to extend the life of the flash memory that is rewritable with upper limited number of rewriting repetition.

The logical address is processed as described in the above-mentioned process ② at that time, the block in which the data is to be written is moved thereby between before update and after update during the swap process of the block, the same address can be found in view of FAT, and the following access can be executed properly.

To simplify the management for updating on the logical-physical conversion table described herein above, the swap process of the block is specified as a process to be completed in 1 segment. In other words, the swap process of the block does not extend over two or more segments.

2-4. Logical-physical Address Conversion Table

Figure 5B:
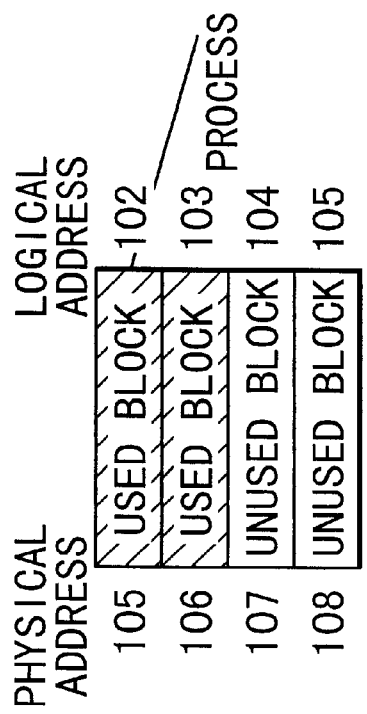
FIG. 5B is a drawing illustrating the status of the stick memory blocks after data updating processes among drawings illustrating the concept of updating processes and physical and logical addresses in the stick memory of the present embodiment.

As understood from the description with reference to FIGS. 5A and 5B, in the swap process of the block, the correspondent relation between the physical address and the logical address is changed. Therefore, to realize the access for reading/writing the data from/in the flash memory, a logical-physical address conversion table that indicates the correspondent relation between the physical address and the logical address is required. In detail, FAT refers the logical-physical address conversion table, the physical address corresponding to the logical address that is assigned by FAT is specified, and the block indicated by means of the specified physical address can be accessed. In other words, the access to the flash memory by FAT is impossible without the logical-physical conversion table.

Conventionally, for example, when a stick memory 1 is attached to a set body served as a driving apparatus, the microcomputer of the set body side checks the memory content of the stick memory 1 to thereby construct the logical-physical address conversion table in the set body side, and the constructed logical-physical address conversion table is stored in RAM of the set body side. In other words, the logical-physical address conversion table information is not stored in the stick memory 1.

On the other hand, the present example is structured so that the logical-physical address conversion table is stored in the stick memory 1 as described hereinafter.

FIG. 6 conceptually shows the structure of the logical-physical address conversion table to be stored in the stick memory 1 of the present example. In detail, in the present example, for example, a table information in which 2 byte physical address corresponding to the logical address is stored in ascending order of the logical address is structured. A physical address and logical address are represented by 2 bytes respectively as described hereinbefore. The reason is that, because there are 8192 blocks in the case of the flash memory having the maximum capacity of 128 MB, the number of bits that is sufficient for covering 8192 blocks at most is required. For this reason, the physical address and logical address exemplified in FIG. 6 are represented by 2 bytes according to the reality. Herein, 2 bytes number is described by means of hexadecimal digit. 0x indicates that the following value is a number described by means of hexadecimal notation. The notation in which 0x indicates a hexadecimal digit will be used in the following description for notation of a hexadecimal digit. In some cases, 0x is omitted in drawings to avoid complex notation.

An exemplary structure of a logical-physical address conversion table structured based on the concept described herein above with reference to FIG. 6 is shown in FIGS. 7A and 7B. The logical-physical address conversion table is stored in a certain block of the flash memory as shown in FIGS. 7A and 7B. The block is specified to be in the last segment. First, as shown in FIG. 7A, 2 page area consisting of pages 0 and 1 out of the pages to be divided into the blocks is assigned as the logical-physical address conversion table served for the segment 0. For example, as described with reference to FIG. 9, if the capacity of the flash memory is 4 MB, because there is only 1 segment, the area of the pages 0 and 1 is the area of the logical-physical address conversion table. For example, if the capacity of the flash memory is 8 MB, then because there are 2 segments, not only the pages 0 and 1 assigned as the logical-physical address conversion table for the segment 0 and also subsequent 2 pages namely the pages 2 and 3 are assigned additionally as the logical-physical address conversion table for the segment 1.

With further increasing the capacity of the flash memory, the area assigned as the logical-physical address conversion table for the segment is set every subsequent 2 pages. If the capacity of the flash memory is 128 MB, which is the maximum value, because there are 16 segments, the area of the pages up to the segment 15 is assigned at most as an area of the logical-physical address conversion table. Accordingly, in the case of a flash memory having a capacity of 128 MB, namely the maximum capacity, 32 pages are used, the page N shown in FIG. 7A is 31, which is the maximum value. As understood from the above-mentioned description, the logical-physical address conversion table is managed in segment unit.

FIG. 7B shows a diagram for illustrating selected 2 page data area for describing the structure of the logical-physical address conversion table for 1 segment. In other words, as shown in FIG. 3E, the data area of 1 page consists of 512 bytes, and FIG. 7B shows 1024 (=512×2) bytes expanded on the area.

As shown in FIG. 7B, the area of 1024 bytes which is the data area for 2 pages is divided into 2 byte sub-areas, and the 2 byte sub-areas are assigned as the sub-area for logical address 0, sub-area for logical address 1, . . . successively from the head, and the last 2 byte sub-area consisting of 991-th byte and 992-th byte from the head is assigned as the sub-area for logical address 495. The physical address corresponding to each logical address is written in the 2 byte sub-area. Accordingly, in the logical-physical address conversion table of the present example, in the case that the correspondent relation between the physical address and the logical address is changed concomitantly with swap process of the block due to actual data update, the table information is rewritten so as that the storage of the physical address is updated with reference to the logical address.

The residual area consisting of 32 bytes from 993-th byte to the last 1024-th byte is assigned as the area where the physical address of the remainder blocks is stored. In other words, the physical address of 16 remainder blocks can be managed. The remainder block described herein is referred to as so-called work block that is set as the area where the data to be rewritten is evacuated temporarily, for example, when the data is updated in block unit.

Though 1 segment is divided into 512 blocks in the above-mentioned description, the number of manageable blocks is 496, and these blocks consist of blocks from the block for logical address 0 to the block for logical block 495 in the table structure shown in FIG. 7B. The reason is that the above-mentioned remainder address is set actually, and the defect (non-available area) of a certain number of blocks is permitted in the flash memory and there is considerable number of defect blocks actually. Accordingly, the structure that is served to manage 496 blocks is sufficient for managing blocks that are effective for writing or erasing.

In the case of the block in which the logical-physical address conversion table is stored as described herein above, as shown in FIG. 4, 0 is set in the bit 3 of the management flag as the data content of the management flag in the redundant area of each page which forms the block. As the result, the management flag indicates that this block is the block where the logical-physical address conversion table is stored.

The block in which the logical-physical address conversion table is stored is subjected to swap process described herein above with reference to FIGS. 5A and 5B without exception in the case that the content of the logical-physical address conversion table is rewritten. Therefore, the block where the logical-physical address conversion table is recorded is unstable, it is impossible to specify so that the logical-physical address conversion table is stored in a specified block. FAT accesses to the flash memory to search the block having the above-mentioned management flag bit 3 of "0", and thereby identifies the block where the logical-physical address conversion table is stored. The block where the logical-physical address conversion table is stored is specified to be located in the segment having the last number in the flash memory in the present example so that FAT easily searches the block where the logical-physical address conversion table is stored. FAT can search the logical-physical address conversion table only by searching the block of the segment having the last number. It is not necessary to search all the segments of the flash memory to search the logical-physical address conversion table. The logical-physical address conversion table shown in FIGS. 7A and 7B is stored, for example, when the stick memory 1 is fabricated.

The relation between the flash memory capacity and the size of the logical-physical address conversion table is described with reference to FIG. 9 again. As described herein above with reference to FIGS. 7A and 7B, the size of the logical-physical address conversion table served for managing 1 segment is 1024 bytes, which is equivalent to 2 pages, namely 1 KB. Accordingly, as shown in the logical-physical conversion table in FIG. 9, the size of the logical-physical address conversion table is 1 KB in the case that the capacity of the flash memory is 4 MB (1 segment). The size of the logical-physical address conversion table is 2 KB (4 pages) in the case that the capacity of the flash memory is 8 MB (2 segments). In the case that the capacity of the flash memory is 16 MB, the size of the logical-physical address conversion table is 4 KB (8 pages) for 2048 blocks=4 segments, and the size of the logical-physical address conversion table is 2 KB (4 pages) for 1024 blocks=2 segments. In the case that the capacity of the flash memory is 32 MB (4 segments), the size of the logical-physical address conversion table is 4 KB (8 pages), in the case that the capacity of the flash memory is 64 MB (4 segments), the size of the logical-physical address conversion table is 8 KB (16 pages), and in the case that the capacity of the flash memory is 128 MB (16 segments) namely the maximum, the size of the logical-physical address conversion table is 16 KB (32 pages).

In the structure of a file system of, for example, a conventional flash memory, the substantial address value is not stored in the physical address area corresponding to the logical address to be unused on the logical-physical address conversion table because it is uncertain.

One example is shown herein under. It is assumed that, for example, logical addresses 0x0000, 0x0001, 0x0002, 0x0003 are already used in the logical-physical address conversion table shown in FIG. 8B, then physical address values on which the data, for example, 0x0002, 0x0006, 0x0007, and 0x0008 have been written correspondingly to the logical addresses (0x0000 to 0x0003) are stored in the storage area of the corresponding physical address.

On the other hand, if the logical address 0x0004 is unused, then a null value (namely, the value for identifying that the address is unused) namely 0xFFFF is set in the storage area of the physical address to which the logical address 0x0004 corresponds.

When the data corresponding to the logical address 0x0004 is wanted to be recorded newly by use of the logical-physical address conversion table shown in FIG. 8B, the block which is physically unused is searched in the layered structure that is different from the logical-physical address conversion table by means of, for example, FAT, and the data is written in the block which has been searched. The physical address that indicates the block on which the data is newly written is written on the storage area corresponding to the logical address 0x004 of the logical-physical address conversion table to thereby update the content.

Such management of the logical-physical address conversion table could cause the disadvantage as described herein under.

It is assumed that the data to be processed in the set body side is the time series data (the stream data so-called in the present example) having so-called real time characteristic namely the moving picture data or audio data such as music.

Further it is assumed that the set body employs a structure in which the input stream data is subjected to signal process in real time and the data is recorded in a stick memory 1 as the recorded data.

At that time, if management style of the logical-physical address conversion table as described herein above with reference to FIG. 8B is employed, the unused block is searched necessarily when the data is recorded. However, the searching of the unused block described herein above is very heavy process because it is required to write at a low average speed so that the input recording data does not overflow when the stream data as described herein above is recorded. In other words, it is difficult to record the stream data having real time characteristic and only the document file or still picture file, which does not require the real time characteristic, can be recorded actually.

In the logical-physical address conversion table of the present example, the physical address of the block that is managed as the unused area is assigned previously to the storage area corresponding to the unused logical address. The detailed example is shown in FIG. 8A.

In the logical-physical address conversion table shown in FIG. 8A, logical addresses 0x0000, 0x0001, 0x0002, and 0x0003 are in use, physical address values, for example, 0x0002, 0x0006, 0x0007, and 0x0008, which are actual data, are stored on the storage area of the corresponding physical address, and in this meaning this case is the same as the case shown in FIG. 8B. The logical address 0x0004 is unused, in this meaning this case is the same as the case shown in FIG. 8B.

However, in the present example, 0xFFFF namely null value is not set on the storage area of the physical address to which the unused logical address 0x0004 is corresponding, but, for example, 0x0009 is stored as the physical address for indicating the block in the unused area. Only the storage area corresponding to the logical addresses 0x0004 is shown as the unused area, but different physical addresses of the unused block are stored in the same way on storage areas corresponding to other unused logical addresses.

In the case that the logical-physical address conversion table is structured as described herein above, the physical address that indicates the free area in the logical-physical address conversion table is indicated correspondingly to the logical address.

As the result, in FAT, the physical address of the unused block is correlated to the logical address previously by referring to the logical-physical address conversion table, and it is not necessary to perform search process for searching the unused block differently from the case shown in FIG. 8B. In other words, the physical address corresponding to the logical address managed as the free area on FAT is obtained by referring to the logical-physical address conversion table, and the block indicated by the physical address is accessed and the data is written. As the result, the process load on the microcomputer of the set body is significantly reduced, and for example, the recording of the stream data described herein above is realized easily. Of course, the data such as the document file or still picture data for which the real time process is not required is written in a short time by use of the file system of the present example shown in FIG. 8A.

The logical-physical address conversion table in which the unused logical address and the physical address are correlated previously as described herein above is recorded or updated in the stick memory 1 as required, such recording or updating is performed by use of a driving apparatus, the unused logical address and the physical address are correlated at least before the time point when high speed writing process described hereinafter is executed.

Actually otherwise, the driving apparatus prepares the address conversion table for correlating all logical addresses and all physical addresses mutually and stores it in the stick memory 1 during the first formatting process before the stick memory 1 is used, and the updating is thereafter performed as described with reference to FIGS. 5A and 5B when recording or editing operation is performed.

3. Structure of Driving Apparatus

Subsequently, the structure of the driving apparatus of the present example is described with reference to FIG. 10.

Figure 10:
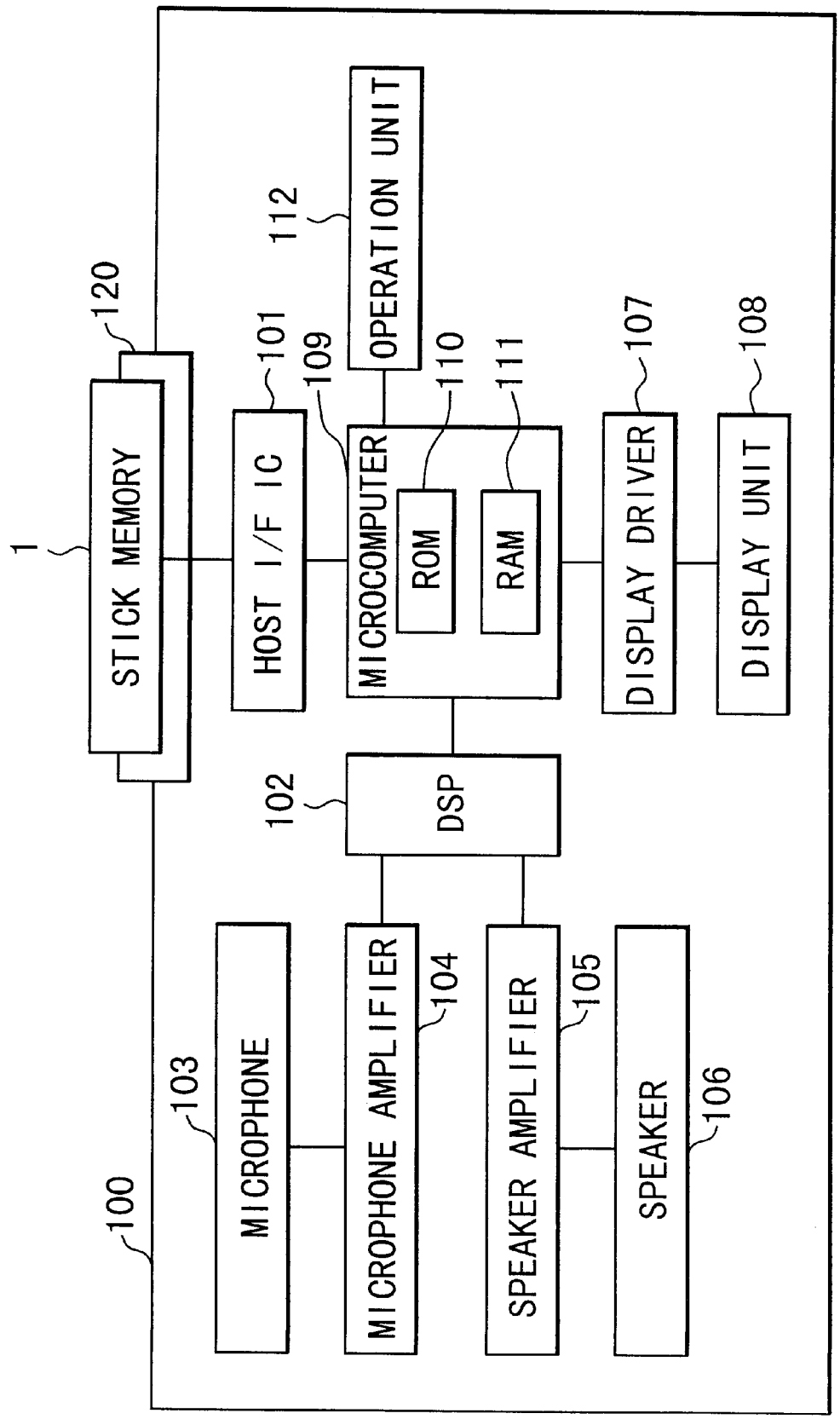
FIG. 10 is a block diagram of the drive apparatus of the present embodiment.

FIG. 10 shows the structure of the set body, or body apparatus of the driving apparatus that is capable of reading, writing, and editing the data correspondingly to the stick memory 1 described hereinbefore. The set body 100 and the stick memory 1 shown in FIG. 10 constitute a file memory system. The type of the main data that is processed as the writing/reading target for the stick memory 1 by the set body 100 is diversified, for example, the moving picture data, still picture data, voice data, high sound quality audio data (referred to as music data hereinafter), and control data may be processed.

In the present example, the case in which a system for recording or reproducing voice data, which is one of the main stream data, is described because the purpose of the present example emphasizes the efficient recording of the stream data, furthermore of course the system may be used for recording other stream data or the data file containing the data which does not require real time characteristics by providing input-output system or process system for the data such as moving picture, still picture, or music in the set body 100.

The structure of the set body 100 has a detaching mechanism 120 by means of which the set body is mounted detachably, the stick memory 1 attached to the detaching mechanism 120 communicates the date with the microcomputer 109 by way of a host interface IC 101.

The set body 100 is provided with a microphone 103, the voice that is received by, for example, the microphone 103 is supplied to a DSP (Digital Signal Processor) 102 as a voice signal by way of a micro-amplifier 104. In the DSP 102, the input voice signal is converted to a digital audio data, subjected to required signal processes including encoding process, and the voice data is supplied to a control microcomputer 109 as the recording data.

The microcomputer 109 is possible to execute the process for recording this recording data in the stick memory 1 by way of the host interface IC 101.

The microcomputer 109 reads out the audio data or voice data file recorded in the stick memory 1 by way of the host interface IC 101, and supplies the read out data to the DSP 102. In the DSP 102, the supplied data is subjected to required signal processes including demodulation process, and sent out finally to a speaker amplifier 105 as the analog voice signal. In the speaker amplifier 105, the input voice signal is amplified and sent out to a speaker 106. As the result, the reproduced voice is generated.

The microcomputer 109 controls a display driver 107 to thereby display a desired image on the display unit 108. For example, display for displaying a menu or guide display for operation by a user or a file content stored in the stick memory 1 is executed. It is possible that, if an image data such as moving picture data or still picture data is stored in the stick memory 1, the image data is read out and displayed on the display unit 108.

Various keys served for a user to operate various processes on the set body 100 are provided to the operating unit 112. The microcomputer 109 receives the command corresponding to the operation operated to the operation unit 112, and executes the required control process corresponding to the command. The operation content may be a file recording command, file selection command, file reproduction command, or edition command.

In order to realize data writing or reading, that is, recording or reproduction in or from the above-mentioned stick memory 1 by use of the set body 100 having the structure shown in FIG. 10, the logical-physical address conversion table to which FAT refers on the file system is required as described herein above.

Figure 11:
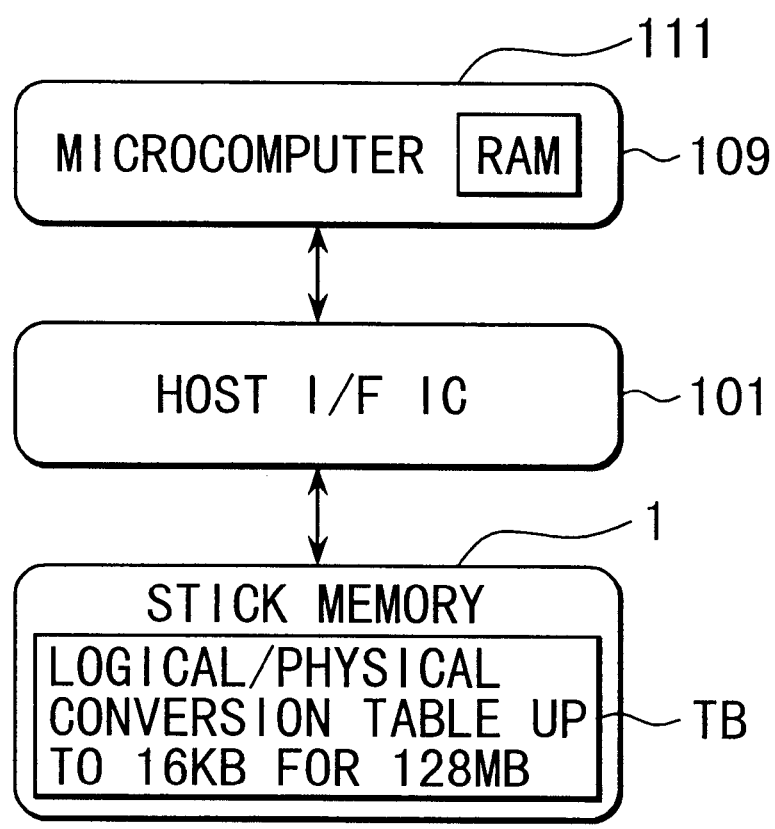
FIG. 11 conceptually illustrates the interface between the microcomputer of the set body and the stick memory in the present embodiment.

The interface between the microcomputer 109 of the set body 100 based on the structure shown in FIG. 10 and the logical-physical address conversion table stored in the stick memory 1 is shown conceptually in FIG. 11.

For example, when the stick memory 1 of the present example is mounted, the required data selected from among the logical-physical address conversion table stored in the stick memory 1 is read by way of the host interface IC 101, and stored in an internal RAM 111.

In view of the above-mentioned structure, the process for constructing the logical-physical address conversion table is not necessary as the process of the microcomputer of the set body 100 in the present example, waiting time for constructing the logical-physical address conversion table by use of the microcomputer is eliminated, and the starting process of the file system performed when, for example, the stick memory 1 is attached takes a very shorter time than that of the conventional system.

Furthermore, as described with reference to FIG. 8A, because the logical-physical address conversion table in which the physical address of the unused block is correlated to the unused logical address as described with reference to FIG. 8, the access to the unused block by means of FAT is executed rapidly and lightly in comparison with the convention system. Particularly, as described with reference to FIG. 10, the present embodiment is effective for the case in which the set body 100 employs the structure for recording the data that requires real time process such as voice data.

The structure of the set body 100 shown in FIG. 10 is only an example, and not limited to this example. As long as the structure that can write the data on the stick memory 1 is employed, any type of the recorder may be used.

4. FAT Structure

As described in the section of the file system layered structure with reference to FIG. 2, FAT performs the file management process.

In detail, to realize the recording/reproducing in/from the stick memory 1 by use of the driving apparatus having the structure as described in FIG. 10, the file memory position management by FAT is referred concomitantly with the request in the application processing, and further the above-mentioned logical-physical address conversion is performed and the actual access is performed.

The structure of FAT is described herein under.

Figure 12:
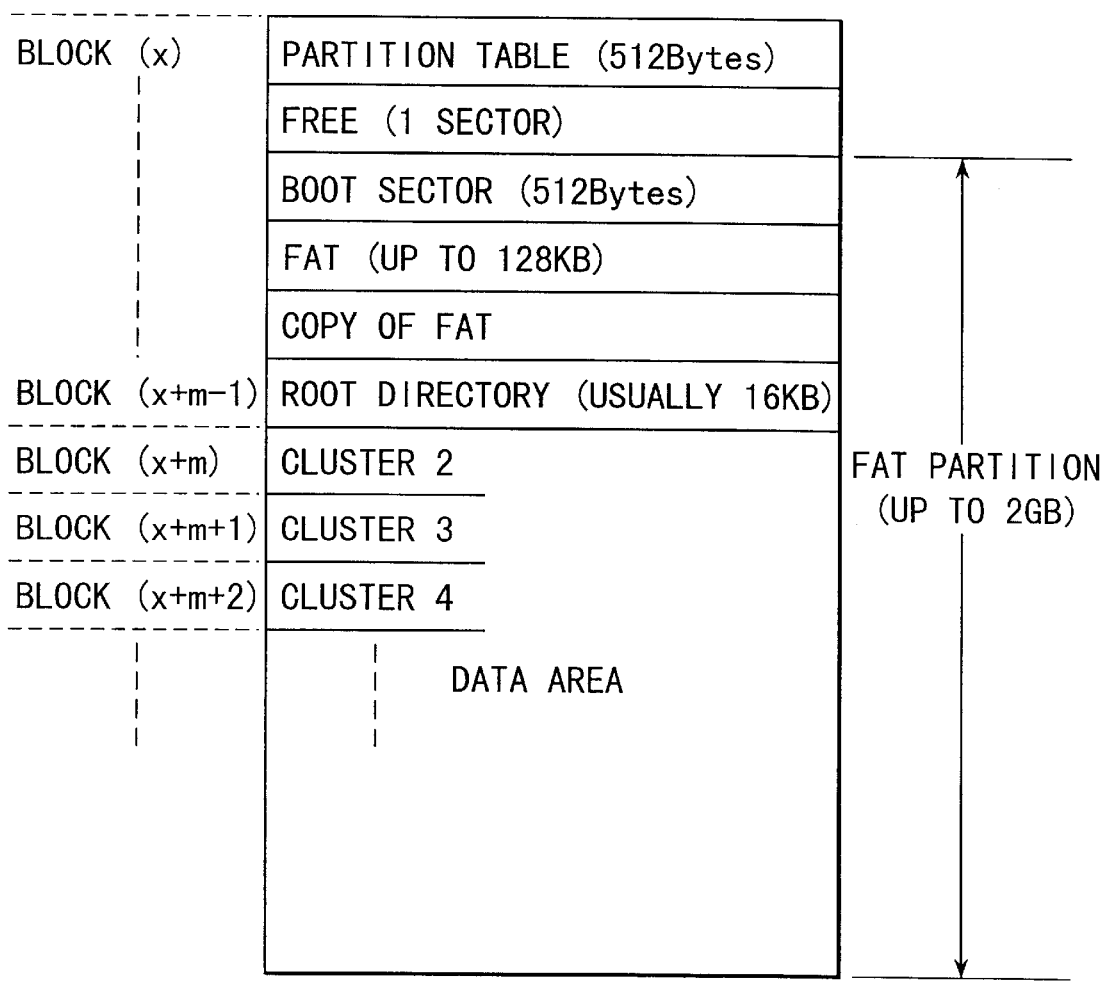
FIG. 12 illustrates the FAT structure.

FIG. 12 shows the outline of the management structure by means of FAT. FAT and the logical-physical address conversion table are stored in the stick memory 1 in the present example, and the FAT structure shown in FIG. 12 is the management structure in the stick memory 1.

As shown in FIG. 12, the FAT management structure comprises a partition table, free area, boot sector, FAT, copy of FAT, root directory, and data area.

The cluster 2, cluster 3, . . . , are shown in the data area as unit data, a cluster is one data unit of management unit in FAT management.

The cluster size is generally 4 K bytes in standard FAT, the cluster size may be a number of 2 to the power in the range from 512 bytes to 32 K bytes.

In the case of the stick memory 1 of the present example, 1 block consists of 8 Kbytes or 16 Kbytes as described herein above, and in the case of the stick memory 1 in which 1 block=8 K bytes, the cluster in FAT consists of 8 K bytes. In the case of stick memory 1 in which 1 block=16 K bytes, the cluster in FAT consists of 16 K bytes. In other words, 8 Kbytes or 16 Kbytes are the management unit in FAT management, and are 1 data unit as the block in the stick memory 1. Accordingly, in view of the stick memory, the cluster size in FAT management=the block size of the stick memory. The present example is described based on the assumption that block=cluster for simplification.

Block numbers x, . . . , (x+m−1), (x+m), (x+m+1), (x+m+2) are shown in the left side in FIG. 12, various data that constitute FAT structure are stored in each block as described herein. Actually, the information is not stored respectively in each block that is physically continuous as described herein above.

In FAT structure, first the head and the tailing end address of the FAT partition up to 2 GB are described in the partition table. In the boot area, the identification between 12 bit FAT and 16 bit FAT and the FAT structure such as size, cluster size, and the size of each area are described.

FAT is served as a table that indicate the link structure of the cluster which constitute each file as described hereinafter, and the copy of FAT is described in the subsequent area.

In the root directory, the file name, head cluster number, and various attributes are described. The description of 1 file consumes 32 bytes.

In FAT, the entry and cluster of FAT are in one-to-one correspondence, in the entry of each cluster, the link destination namely the number of the subsequent cluster is described. In the case of a certain file consisting of a plurality of clusters (=blocks), the head cluster number is indicated by the directory, and the next cluster number is indicated in the entry of the head cluster in FAT. Further, the next cluster number is indicated in the entry of the next cluster number. As described herein above, the link of the cluster is described in FAT.

Figure 13:
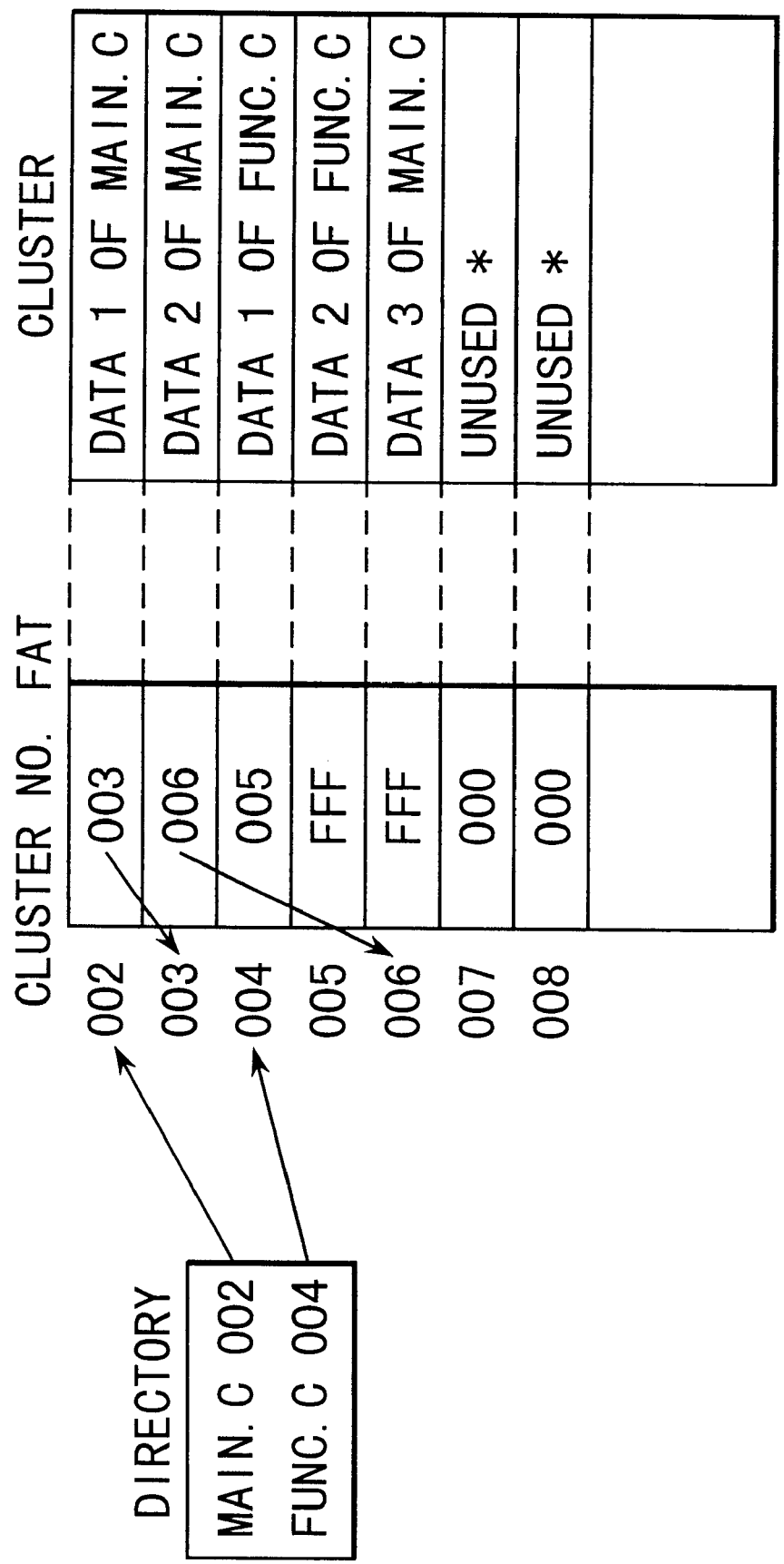
FIG. 13 illustrates the form of cluster management by FAT.

FIG. 13 shows the concept of the above-mentioned link schematically. The values are given in hexadecimal.

For example, if there are two files MAIN. C and FUNC. C, head cluster numbers of these two files, for example, 002 and 004 are described in the directory.

For the file MAIN. C, the next cluster number 003 is described in the entry of the cluster number 002 and the next cluster number 006 is described in the entry of the cluster number 003. Furthermore, if the cluster number 006 is the last cluster of the file MAIN. C, FFF for indicating that this is the last cluster is described in the entry of the cluster number 006.

As the result, the file MAIN.C is stored in the order cluster 002, to 003, and to 006. In other words, it is assumed that the cluster number is identical with the block number in the stick memory 1, it is expressed that the file MAIN.C is stored in blocks 002, 003, and 006. (Because the cluster involved in FAT is the cluster involved in the logical address as described herein above, the cluster is not directly identical with the physical address of the block) Similarly, it is expressed that the file FUNC.C is stored in the order cluster 004 to 005 by means of FAT.

The entry of the cluster corresponding to the unused block is described as 000.

In the directory of each file stored in the root directory area, not only the head cluster number shown in FIG. 13 but also, for example, various data are described as shown in, for example, FIG. 14.

In detail, the file name, extension, attribute, update time information, update date information, head cluster number, and file size are described with the number of bytes shown in FIG. 14.

For the sub-directory that is the lower layer of a certain directory, the data are stored not in the area of the root directory shown in FIG. 12 but in the data area. In other words, the sub-directory is treated as the file that has the directory structure. In the case of the sub-directory, the size is unlimited, and the entry to itself and the entry to the parent directory are needed.

Figure 15:
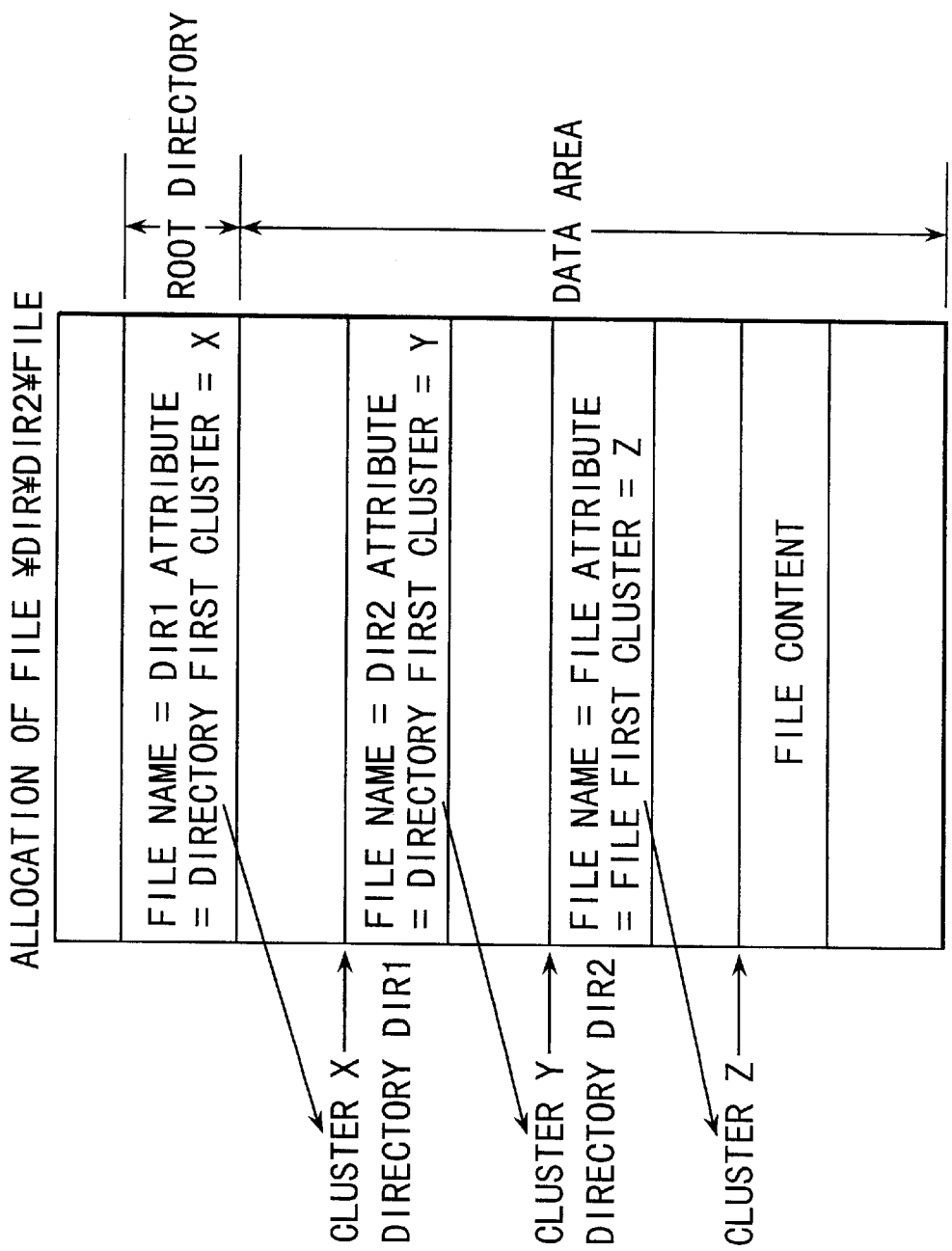
FIG. 15 illustrates a subdirectory and file storage format.

FIG. 15 shows an exemplary structure in which there is DIR1 whose file attribute is a directory, namely subdirectory in a certain root directory, there is DIR2 whose attribute is a directory, namely subdirectory in it, and furthermore there is the file FILE in it.

In other words, the head cluster number is shown as the sub-directory namely DIR1 in the area of the root directory, and clusters X, Y, and Z are linked by means of the above-mentioned FAT. As understood from FIG. 15, the subdirectories DIR1 and DIR2 are treated as the file, and incorporated in the link of FAT.

Further, the method of management by FAT is explained below with reference to FIG. 23.

Figure 23:
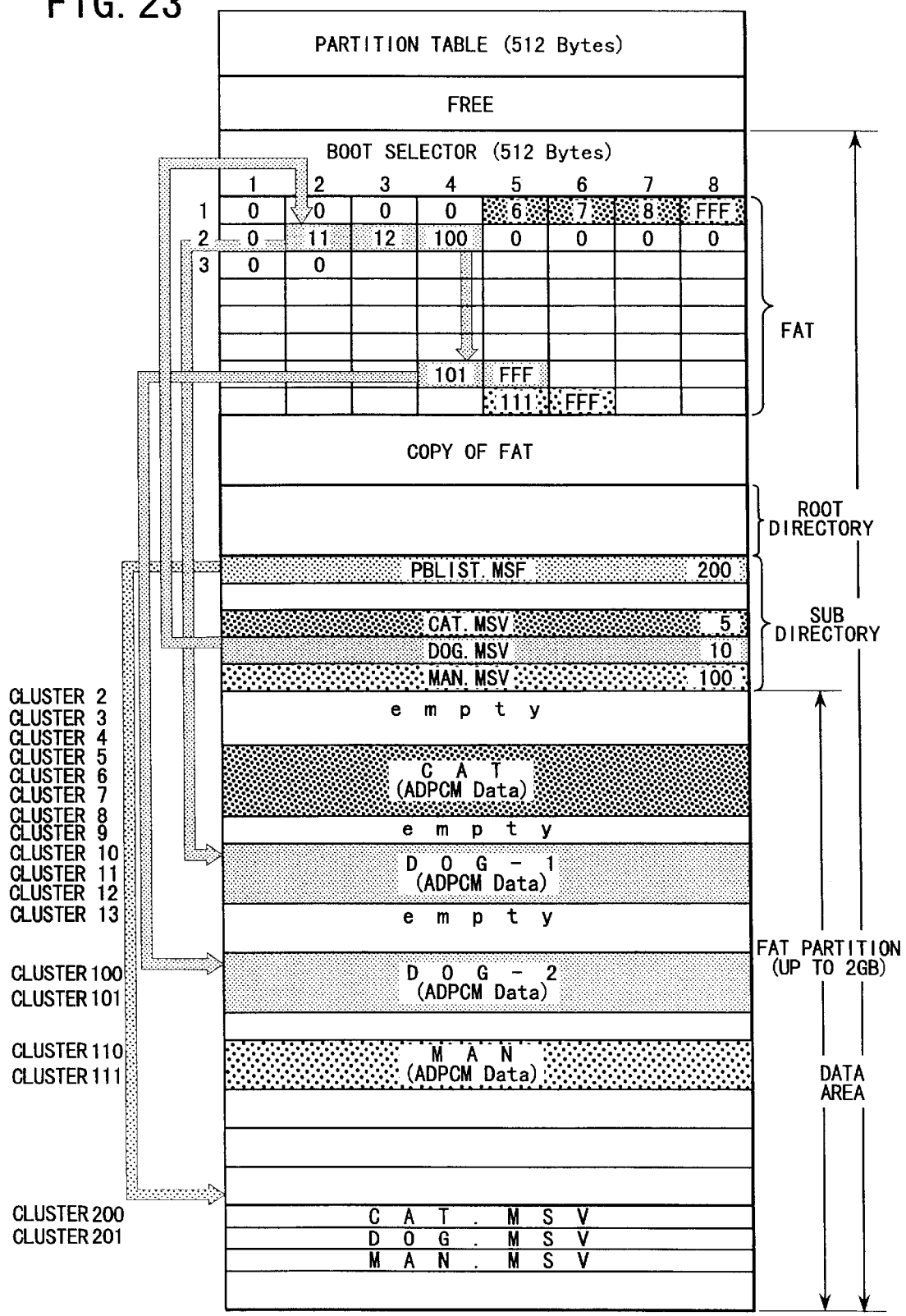
FIG. 23 illustrates the directory structure.

FIG. 23 schematically shows the memory contents, wherein a partition table, a free area, a boot sector, a FAT area, a FAT backup area, a root directory area, a subdirectory area, and a data area are layered from the top.

The above described memory map shows the state of the memory after logical to physical address conversion based on the logical-physical address conversion table.

The boot sector, FAT area, FAT backup area, root directory area, subdirectory area, and the data area are all together called a FAT partition area.

The addresses of the beginning and end of the FAT partition area are recorded in the above-described partition table.

Generally, the above-described partition area is not provided in FAT used for a floppy disk.

Because nothing but a partition table is recorded on the first track, a free area exists on the first track.

Next, a FAT structure size, cluster size, and respective area sizes are recorded in the boot sector depending on 12- or 16-bit FAT.

FAT manages the locations of files recorded in the data area.

The FAT copy area is a FAT backup area.

File names, first cluster address, various attributes are recorded in the root directory area wherein 32 bytes are used for such data of one file to be recorded.

The subdirectory area exists as files showing file attributes, that is, a directory and four files called PBLIST.MSV, CAT.MSV, DOG.MSV, and MAN.MSV in an embodiment showing in FIG. 23.

File names and their recording positions on FAT are managed in the above-mentioned subdirectory. In other words, in FIG. 23, an address "5" on FAT is managed for a slot where a file name CAT.MSV is recorded, and an address "10" on FAT is managed for a slot where a file name DOG.MSV is recorded.

Cluster 2 and subsequent clusters indicate a real data area where voice data obtained by compression process with ADPCM is recorded in the embodiment of the present invention.

Further, address 110 on FAT is managed for the slot where a file name MAN.MSV is recorded.

In the embodiment of the present invention, ADPCM compression-processed voice data with a file name CAT.MSV is recorded in clusters 5 to 8. In addition, the former part DOG-1 of ADPCM compression-processed audio data with a file name DOG.MSV is recorded in clusters 10 to 12 and the latter part DOG-2 of ADPCM compression-processed audio data with a file name DOG.MSV is recorded in clusters 100 to 101.

Further, ADPCM compression-processed audio data with a file name MAN.MSV is recorded in clusters 110 and 111.

The above embodiment gives an example of a single file divided into two portions that are discretely recorded.

In the above embodiment, areas called "empty" on the data area are recordable.

Clusters 200 and subsequent clusters indicate file name management areas where a file called CAT.MSV the recorded in cluster 200, a file called DOG.MSV in cluster 201, and a file called MAN.MSV in cluster 202.

To rearrange the files, files are rearranged in cluster 200 and subsequent clusters.

First, the partition table of the first area is referenced to record the addresses of the beginning and end of the FAT partition area when the above-mentioned stick memory is inserted.

After the boot sector area is reproduced, the root directory area and the subdirectory area are reproduced.

Then, the slot where playback management data PBLIST.MSF recorded in the subdirectory area is recorded is retrieved to reference the address of the end section of the slot where PBLIST.MSF is recorded.

In case of the embodiment of the present invention, since address 200 is recorded at the end section of the slot where the above-described PBLIST.MSF is recorded, cluster 200 is referenced.

Cluster 200 and subsequent clusters are the areas for managing file names and the file playback order wherein a file called CAT.MSV is the first piece, a file called DOG.MSV the second piece, and a file called MAN.MSV the third piece.

On completion of referencing all of the cluster 200 and subsequent clusters, control moves to the above-mentioned subdirectory area and the slots corresponding to file names CAT.MSV, DOG.MSV, and MAN.MSV are referenced.

In FIG. 23, address 5 is recorded at the end of the slot where a file name CAT.MSV is recorded, address 10 is recorded at the end of the slot where a file name DOG.MSV is recorded, and address 110 is recorded at the end of the slot where a file name MAN.MSV is recorded.

When entry addresses on FAT are referenced based on address "5", a cluster address "6" has been entered. When entry address "6" is referenced, a cluster address "7" has been entered. When entry address "7" is referenced, a cluster address "8" has been entered. When entry address "8" is referenced, a code "FFF" meaning an end is recorded.

Therefore, a file called CAT.MSV occupies cluster areas at cluster 5, 6, 7, and 8 and the areas where ADPCM data called CAT.MSV is actually recorded can be accessed by referencing clusters 5, 6, 7, and 8 in the data area.

Next, the following description shows the method for retrieving a discretely recorded file called DOG.MSV.

When entry addresses on FAT are retrieved based on the address "10", a cluster address "11" has been entered.

When entry address "11" is referenced, a cluster address "12" has been entered. When entry address "12" is referenced, a cluster address "100" has been entered. When entry address "100" is referenced, a cluster address "101" has been entered. When entry address "101" is referenced, a code "FFF" meaning an end is recorded.

Therefore, a file called DOG.MSV occupies cluster areas at cluster 10, 11, 12, 100, and 101 and the areas where ADPCM data corresponding to the former part of the file called DOG.MSV is actually recorded can be accessed by referencing clusters 10, 11, and 12 in the data area.

Further, by referencing clusters 100 and 101 in the data area, the areas where ADPCM data corresponding to the latter part of the file called DOG.MSV is actually recorded can be accessed.

Further, when entry addresses on FAT are retrieved based on the address "110", a cluster address "111" has been entered. When entry address "111" is referenced, a code "FFF" meaning an end is recorded.

Therefore, it is found that a file called MAN.MSV occupies cluster areas at clusters 110 and 111.

As explained above, by linking data files recorded discretely on the flash memory, the data files can be sequentially reproduced.

5. Writing Process of Stream Data

Subsequently, a process for recording a stream data in the stick memory 1, that is the most characteristic operation of the present example, is described.

As described herein above, the main data that is handled by the stick memory 1 includes the moving picture data, still picture data, voice data, high sound quality audio data, and control data, and when the stream data having real time characteristic such as voice data, moving picture data, or audio data is recorded, the efficient recording process is required so as to handle the high bit rate stream data.

Figure 22:
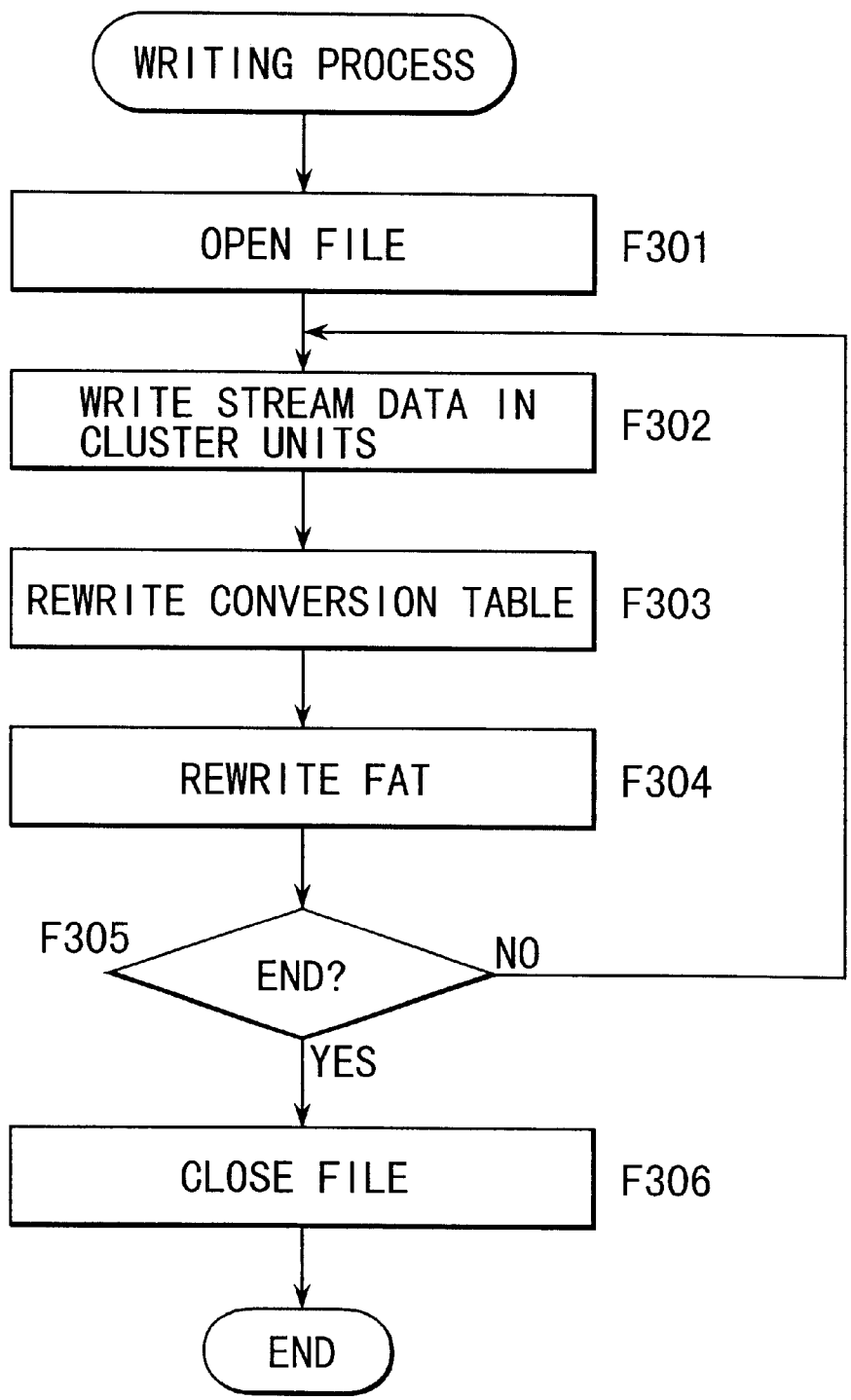
FIG. 22 is a flowchart of writing process of the related art.

The data writing process performed in the present example is referred to as high speed writing process differently from the writing process described hereinbefore with reference to FIG. 22, and described with reference to FIGS. 16, 17, 18A, 18B, 19, and 20.

Figure 16:
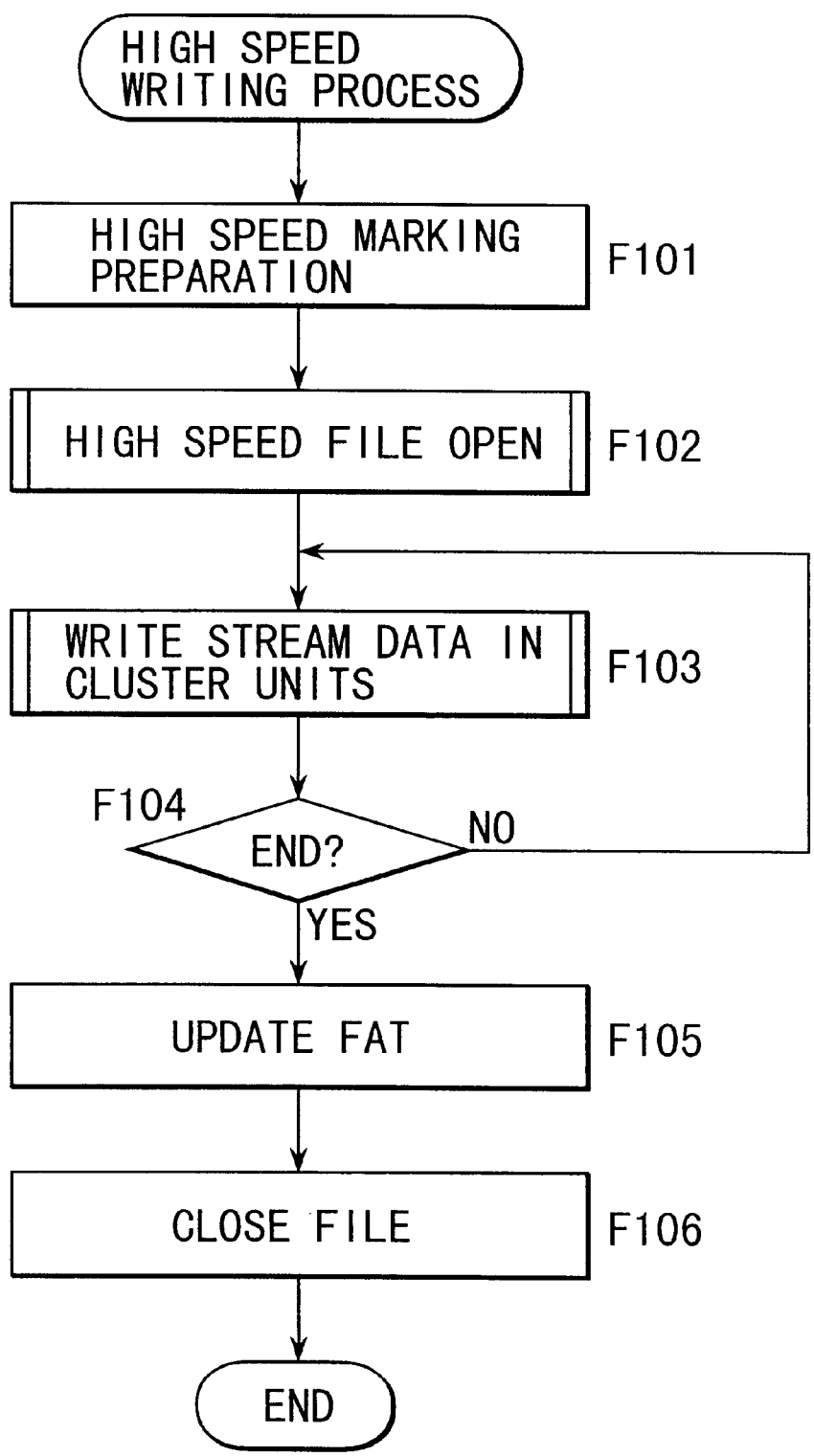
FIG. 16 is a flowchart of high speed writing process of the present embodiment.
Figure 17:
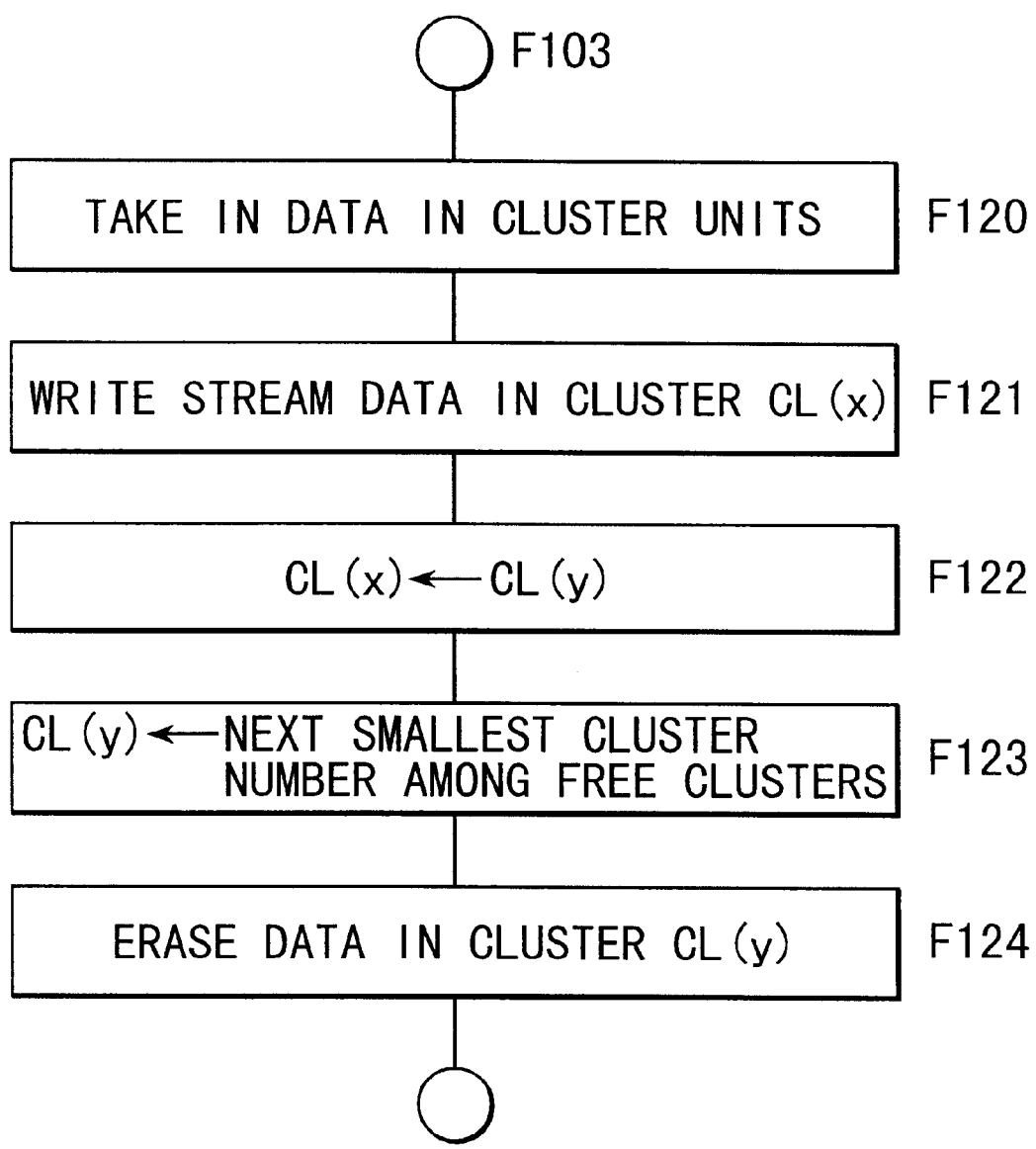
FIG. 17 is a flowchart of cluster data writing in high speed writing process of the present embodiment.
Figure 18A:
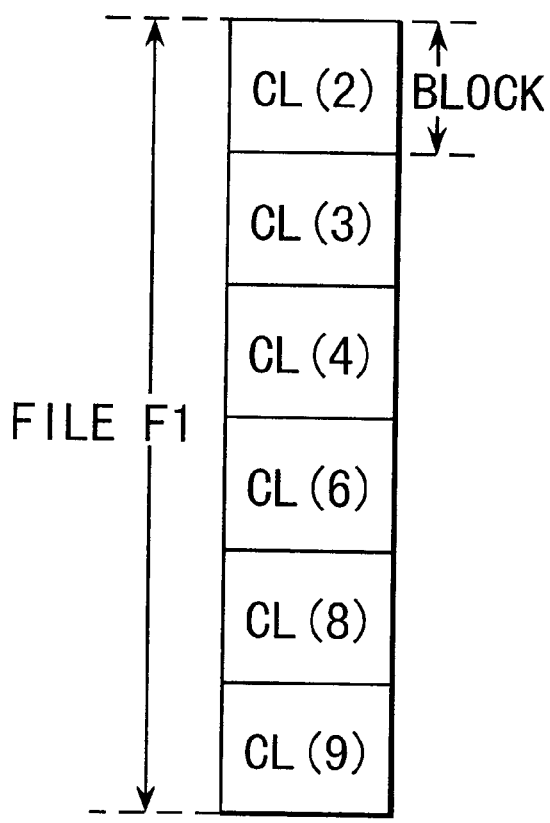
FIG. 18A is the first diagram illustrating an example of high speed writing operation of the present embodiment.
Figure 18B:
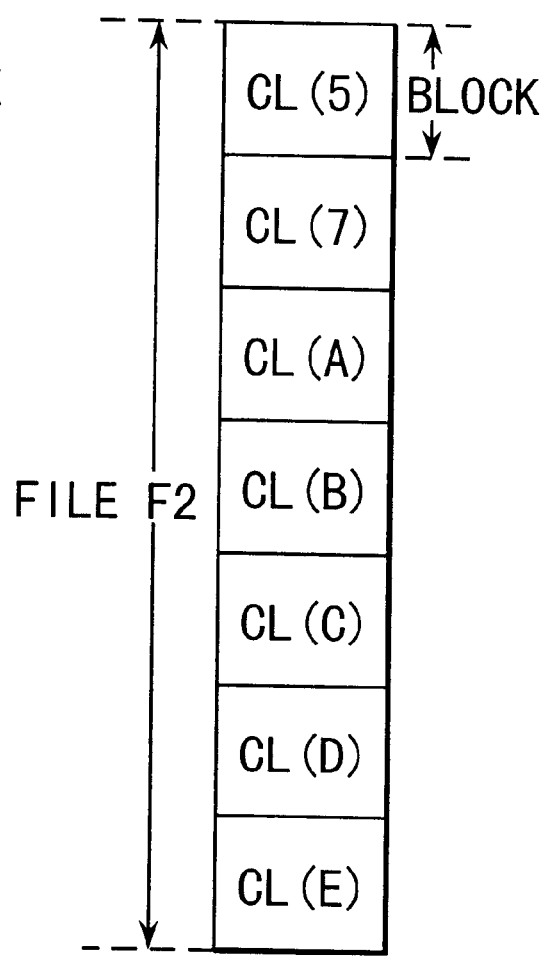
FIG. 18B is the second diagram illustrating an example of high speed writing operation of the present embodiment.

FIG. 16 and FIG. 17 are flowcharts of the process performed under the control of the microcomputer 109 of the driving apparatus, and FIGS. 18A and 18B are diagrams for schematically illustrating the recorded file of a stream data (voice data or the like) in the stick memory 1. FIG. 19 and FIG. 20 show the FAT content before and after the recording process.

A stick memory 1 is mounted in the driving apparatus and recording operation is performed, a user can thereby stores the voice collected by means of a microphone 103 in the stick memory 1 as the voice data.

When a user commands such recording operation, the microcomputer 109 first prepares high speed process marking in step F101. This preparation is a process for preparing a temporary special file entry in the root directory as a file for high speed writing.

Figure 32:
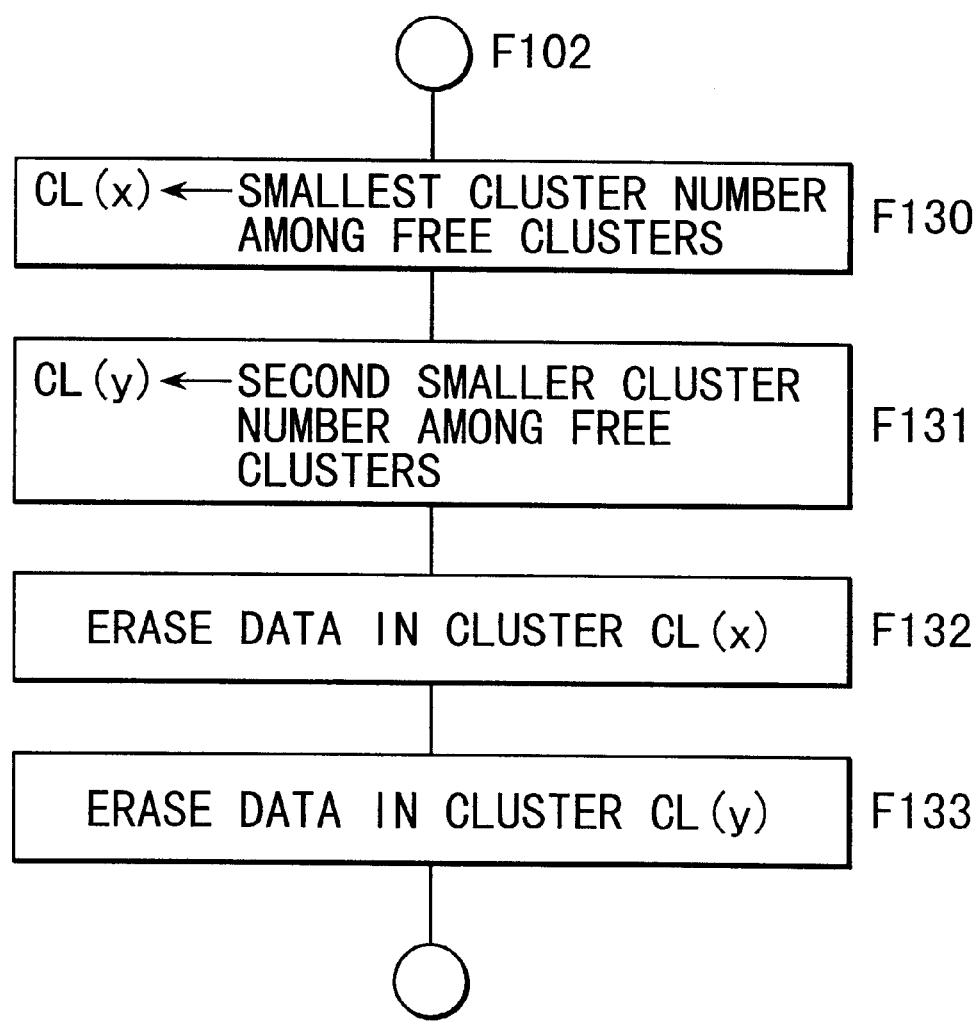
FIG. 32 illustrates high speed file open of the present embodiment.

The high speed file is opened in step F102 depending on the file entry. This processing must be performed before high-speed data writing and is performed for the clusters in which the writing described in detail in FIG. 17 is carried out. The processing in step F102 is explained in detail in FIG. 32.

The cluster number which is the smallest at that time among unused cluster 2 and subsequent unused clusters managed by FAT is set in variable CL(x) in step F130. At this time, the number is converted in advance into a block number of flash memory based on the contents of the logical/physical address conversion table. In step F131, the next smallest number of an unused cluster is set in variable CL(y). Also in this case, the number is converted in advance into a physical address in the same way as in step F130. Next, in step F132, data in a block corresponding to the physical address of flash memory obtained in step F130 is erased. The physical addresses obtained in these steps are held for another use in steps described later. The stream data is written continuously in cluster unit in the stick memory 1 until recording of the voice data that is supplied in steps F103 and F104 is completed (for example, until writing of voice data immediately before the user operates recording stop operation).

The process in step F103 is shown in detail in FIG. 17. Temporally continuous input stream data is accepted in the data quantity in cluster units in step F120. After completion of accepting data in the data quantity in cluster units, the stream data in the data quantity in cluster units which is accepted in a block of stick memory 1 corresponding to cluster CL(x) is written in step F121. The value of CL(x) used at this time is one that is obtained in step F102 in FIG. 16, or further in detail, in step F130 in FIG. 32. Further, in the case of subsequent stream data writing, the value is one that is obtained in step F122 described later.

Next, in step F122, the assigning of physical block addresses on stick memory for the clusters in which stream data is written next is performed by copying the value of CL(y) which is so-called new CL(x). Further, in the next step F123, the next smallest cluster number is obtained from among FAT-managed free clusters for which stream data is written next after next, and a physical block number in stick memory 1 is set in variable CL(y) according to the logical-physical address conversion table. Further, the data in the block of the block physical number of stick memory 1 obtained in step F123 is erased in the next step F124. This process results in the erasing for the next cluster of the cluster whose stream data is written next.

In the above-described examples, to simplify the explanation, the unit of data accepting and writing to flash memory is specified as one cluster, that is, one block on flash memory. Because the unit of writing to flash memory is a page as described in section 2-2, however, for example, the unit of data stream accepting may be specified as the quantity corresponding to one page in flash memory, and the data may also be written in page units. In this case, to write data of one cluster, that is, one block, a writing process is repeated 16 times with writing pages changed if one block comprises 16 pages, and a writing process is repeated 32 times with writing pages changed if one block comprises 32 pages. Evaluation in step F104 is also possible, and the processing of input data decision corresponding to that in step F104 may be carried out whenever one page is written.

The process described herein above is performed in step F103 shown in FIG. 16.

In the process, the stream data is written in the block of the smallest cluster number of logical address among free clusters and the data in the block of a cluster number namely the second smallest cluster number is erased, the reason of the process is that the resuming process described hereinafter is made possible, and the meaning of the process will be described hereinafter.

The process in step F103 shown in FIG. 16, that is, the process shown in FIG. 17 is repeated until recording of the stream data is completed every time when a cluster unit data is taken in, accordingly every time, the block of the smallest cluster number at that time is subjected to writing, and the data in the block of the next smallest cluster number is subsequently erased.

This is because writing is performed in page units as described above in real writing and a cluster to be written next must be erased before data of one cluster, that is, 16 pages of data or 32 pages of data are written. The unit of erasing data from flash memory is a cluster as described above because the time to write one-page data is shorter than that to erase data in one cluster. To erase data in clusters must be sufficiently earlier than at the beginning of writing in the last page and to try to simplify processing, data is always erased in clusters and one preceding cluster.

Further, as a brief description was given in step F102, the same processes as those in steps F121, F122, and F125 are performed and data in cluster CL(x) is erased. By carrying out these processes, the cluster CL(x) in which stream data is written first and the cluster in which stream data is written secondly, that is, the cluster CL(y) having the second smallest number become the condition that data is erased.

This process continues until the stream data is finished, and the sequence proceeds from step F104 to F105 when the all the stream data are written thoroughly, and then FAT is updated correspondingly to the recording operation of the stream data. Herein, the entry of FAT is updated and the link structure corresponding to this recording is recorded, and updating of the directory entry and erasing of the high speed marking in step F101 are executed.

As the result of the above-mentioned operation, the stream data written in step F103 becomes an effective file data managed properly on FAT.

After FAT updating, the file closing is executed in step F106, and the sequence is brought to an end.

The high speed writing process is completed by performing the above-mentioned process, and the stream data file recorded during the process and FAT updating are described with reference to FIGS. 18A and 18B, 19, and 20.

It is assumed that the file F1 shown in FIG. 18A has been recorded in the stick memory 1 already at the time point before this recording.

It is also assumed that the file F1 has been recorded in clusters CL(2), CL(3), CL(4), CL(6), CL(8), and CL(9). Actually, the file F1 is recorded in blocks of physical addresses respectively corresponding to these cluster numbers, and as understood from the above-mentioned description, the physical address of the actual recording block is shown in the address conversion table. Accordingly, FIGS. 18A and 18B do not show the status that one file is recorded in physically consecutive blocks.

In this case, FAT showing clustering of the file F1 is shown in FIG. 19. In detail, the head cluster of the file F1 is designated as cluster CL2 according to the directory entry as shown in FIG. 13, but not shown in the drawing, and 003 is stored in the entry of the cluster CL(2) of FAT in FIG. 19. In other words, it is shown that the cluster CL(2) links to the cluster CL(3). 004 is stored in the entry of the cluster CL(3), it is shown that the cluster CL(3) links to the cluster CL(4). The link is recorded in the same manner in the following, and the value FFF for indicating that this is the last cluster is stored in the entry of the last cluster CL(9).

According to FAT described herein above, FAT manages the file F1 so that the file F1 shown in FIG. 18A is stored in the clusters CL(2), CL(3), CL(4), CL(6), CL(8), and CL(9) in this order.

In this status, 000 for indicating unused cluster is stored in the clusters CL(5), CL(7), and CL(A) and following clusters.

It is assumed that a user commands a new recording at this time point, and the file F2 shown in FIG. 18B is recorded as a new stream data file by means of the above-mentioned high speed writing process.

In this case, if the 7 clusters are used for recording the stream data, then the file F2 is recorded in clusters CL(5), CL(7), CL(A), CL(B), CL(C), CL(D), and CL(E).

In detail, in the process shown in FIG. 17, first the first cluster unit data is recorded in a free cluster of the smallest cluster number, and the cluster CL(5) is used as understood from FIG. 19. At that time, the data of clusters of the next smallest and the second next smallest numbers is erased, in the above-mentioned case, the clusters CL(7) and CL(A) are the target to be erased.

Furthermore, because the free cluster of the smallest number at that time point is used for the next cluster unit stream data, the cluster CL(7) is used. At that time, data in the blocks corresponding to the next smallest and the second next smallest numbers, namely clusters CL(A) and CL(B) is the target to be erased.

The above-mentioned process is repeated, and at the time point when step F104 is completed, the stream data has been recorded in physical address blocks corresponding to clusters CL(5), CL(7), CL(A), CL(B), CL(C), CL(D), and CL(E) respectively as shown in FIG. 18B.

However, because FAT is not updated at this time point and remains as shown in FIG. 19, the link and directory entry of FAT are updated in step F105, and the cluster link corresponding to the file F2 is formed.

In detail, the directory entry for the file F2 is formed, it is indicated that the head cluster is to be the cluster CL(5), and as shown in FIG. 20, 007 is recorded in the entry of the cluster CL(5), 00A is recorded in the entry of the cluster CL(7), 00B is recorded in the entry of the cluster CL(A), . . . and FFF is recorded in the entry of the cluster CL(E) in FAT.

As the result, the file F2 recorded by means of high speed writing process is brought into the status managed by FAT, and becomes effective as a file data.

A supplementary explanation is given with reference to FIGS. 24 to 31.

Figure 24:
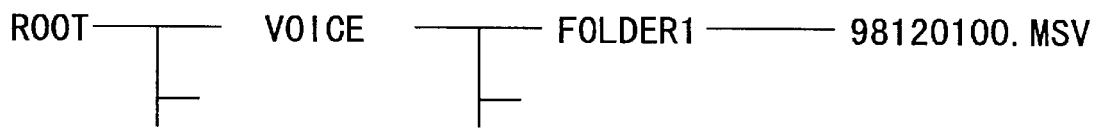
FIG. 24 is the first diagram illustrating directory change in high speed process of the present embodiment.
Figure 27:
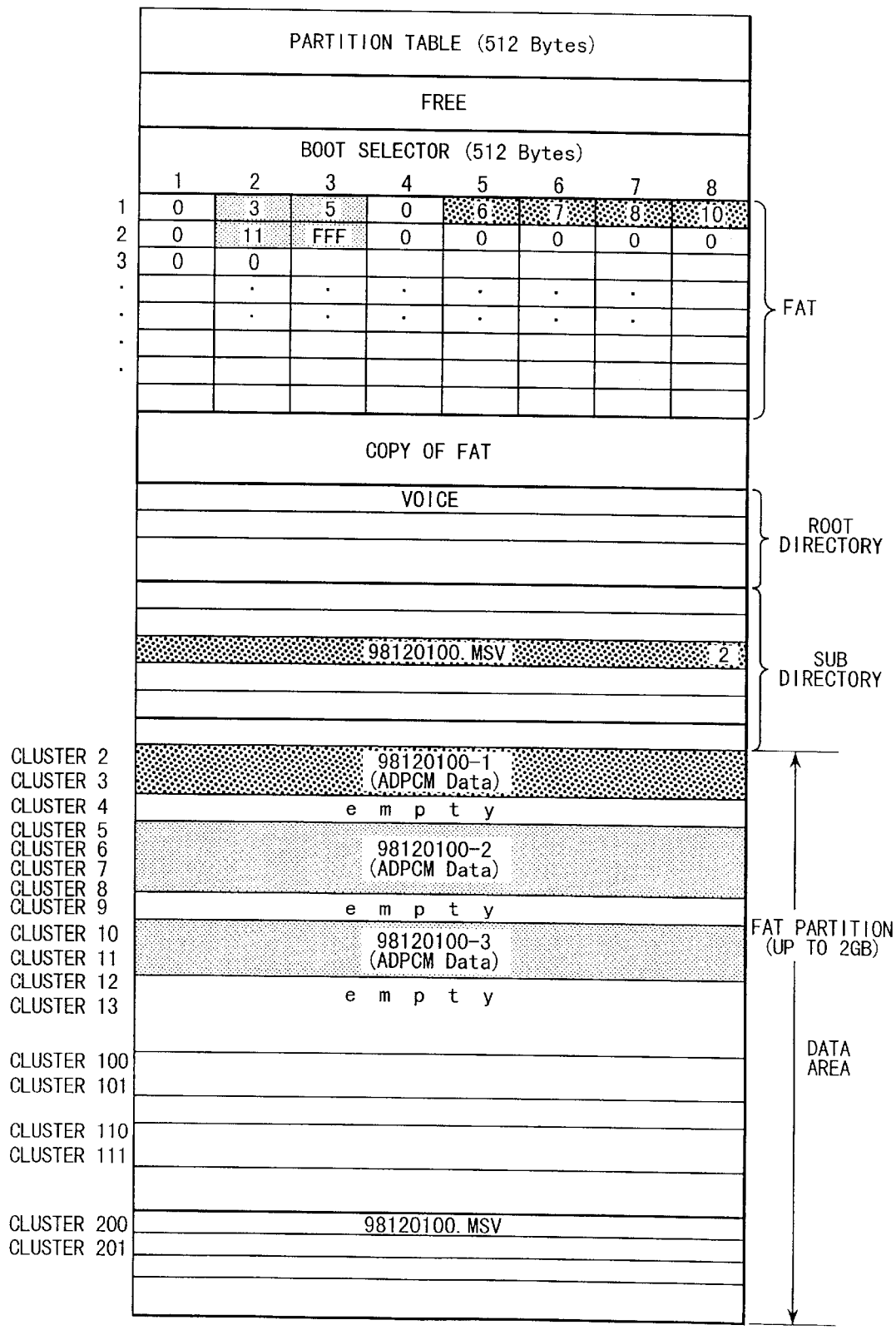
FIG. 27 is the first diagram illustrating directory structure change in high speed process of the present embodiment.

FIG. 24 shows the directories before newly data writing. A subdirectory called "VOICE" as well as not shown subdirectories exist under a root directory. Further, a subdirectory called "FOLDER1" as well as not shown other directories under the VOICE directory. Furthermore, an already recorded file called "98120100.MSV" exists under the FOLDER1 directory. FIG. 27 shows locations of each data on the FAT file system and indicates that a subdirectory called "VOICE" exists under a root directory and that a not shown subdirectory called "FOLDER1" exists under the VOICE subdirectory, and further that a file entry called "98120100.MSV" exists under the FOLDER1 subdirectory. 2 is written in the file entry and 2 indicates the first cluster of the file called "98120100.MSV." In FAT areas, address 3 is written at address 2 on FAT and 5, or a value indicating an address is written at address 3. When each data written discretely is associated on the FAT file system, a file called "98120100.MSV" is recorded in stick memory 1 in the order of cluster 2→cluster 3→cluster 5→cluster 6→cluster 7→cluster 8→cluster 10→cluster 11. This means that the file consists of 98120100-1, 98120100-2, and 98120100-3. Further, the file name is recorded at cluster 200.

Figure 25:
FIG. 25 is the second diagram illustrating directory change in high speed process of the present embodiment.
Figure 28:
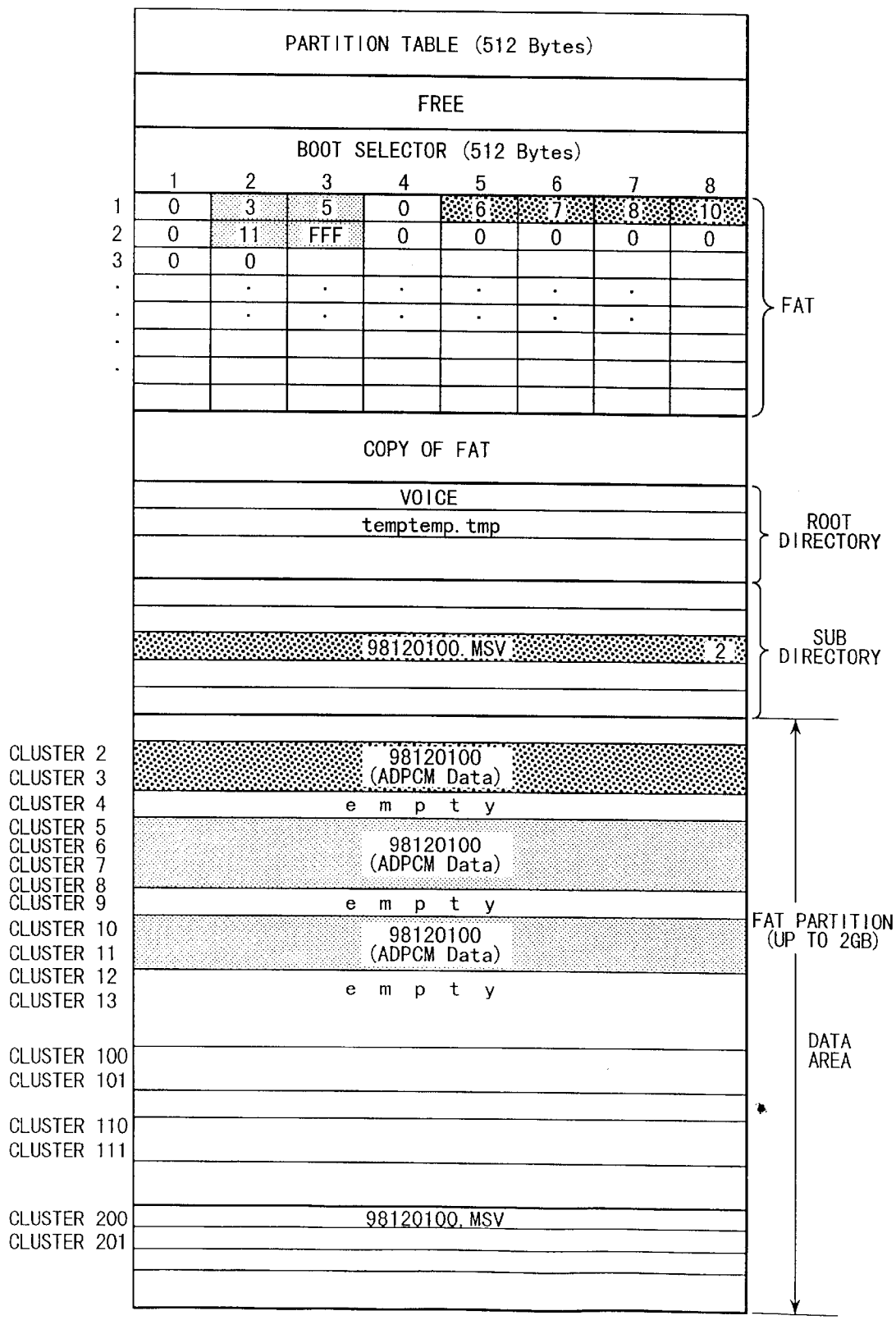
FIG. 28 is the second diagram illustrating directory structure change in high speed process of the present embodiment.

If data is newly written in stick memory 1 having such a directory structure, a special entry file is created tentatively in a root directory in step F101 shown in FIG. 16, that is, a file with a file name called "temptemp.tmp" shown in FIG. 25 is created. In this step, however, only a file entry is created, and so the file size is specified as 0. FIG. 28 shows the status of data on the FAT areas. A file called "temptemp.tmp" in size 0 is created in the root directory.

After that, a free cluster having the smallest cluster number which is not cluster 1 is retrieved in the following method. Each FAT area is checked one by one to find an area where 0 is already written. In this example, it is found that a cluster corresponding to address 4 is free. The address 4 indicates the process to find CL(x) for high speed file open in step F102 shown in FIG. 16. In the case of retrieving a free cluster having the next smallest cluster number, it is found that the cluster corresponds to address 9 and CL(y) for high speed file open is 9. Then, respective block numbers on real flush memory corresponding to clusters 4 and 9 are obtained based on the logical/physical address conversion table, and corresponding blocks are erased according to the obtained physical addresses, thereby resulting in the completion of the high speed file open process in step F102 shown in FIG. 16.

Figure 29:
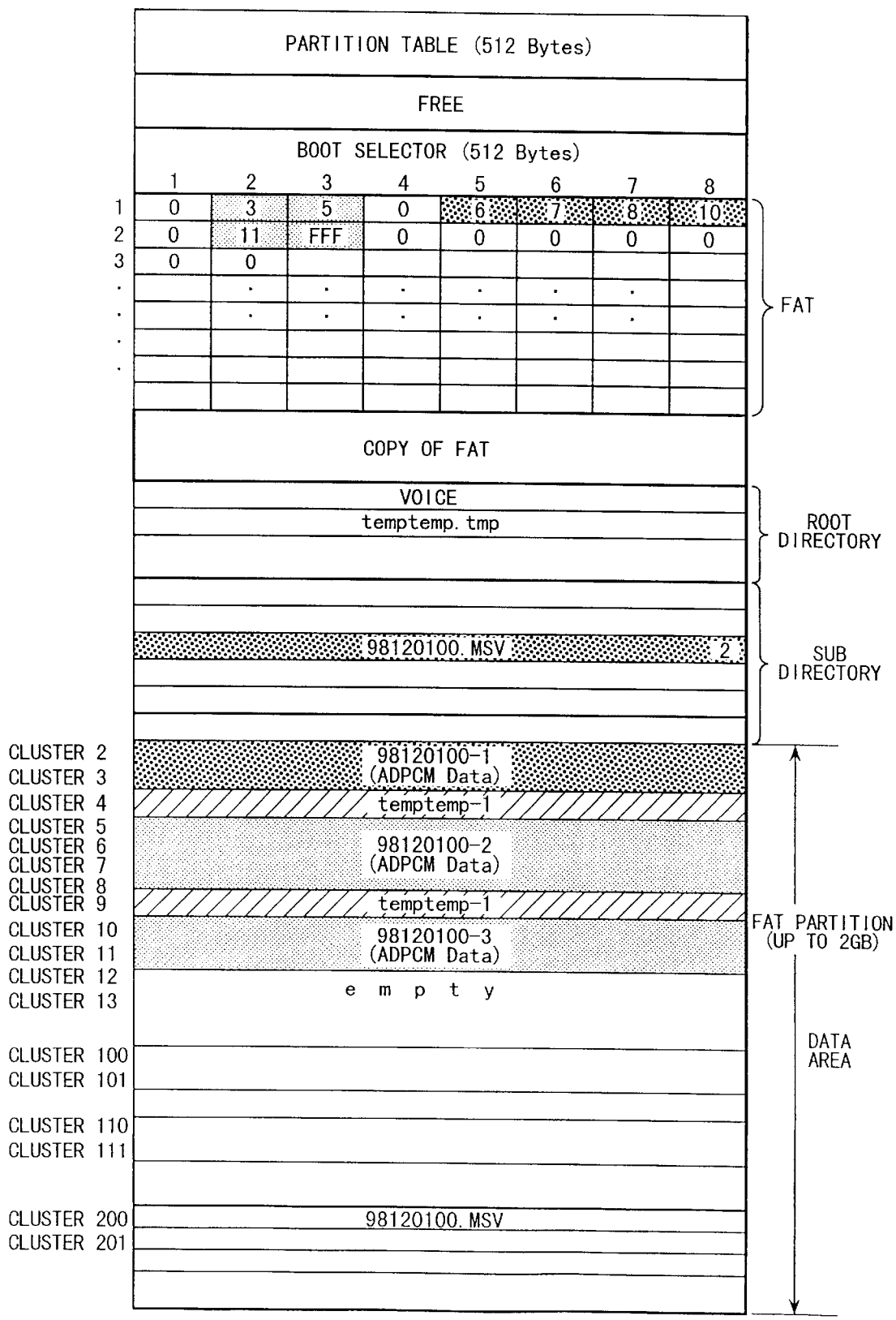
FIG. 29 is the third diagram illustrating directory structure change in high speed process of the present embodiment.

FIG. 29 indicates the state of writing stream data in the stick memory 1 in process. In this figure, messages are recorded at clusters 4 and 9. For example, temptemp-1 and temptemp-2 are the names described in the figure for convenience sake and so these names are not managed on the real file management system. In an usual data writing procedure, writing is performed by using the FAT file system. Therefore, for example, not 0, but 9 is written in the location indicating address 4 in FAT areas. However, in the present embodiment, such processing is not performed in that step, and therefore 0 is written in the location indicating address 4 in the same way as shown in FIG. 28. At this time, data is already erased at cluster 12, and cluster 12 is specified in variable CL(x) as the next cluster for data writing, and further cluster 13 is specified in variable CL(y) as the next cluster for data writing after next, and then data is erased.

Figure 30:
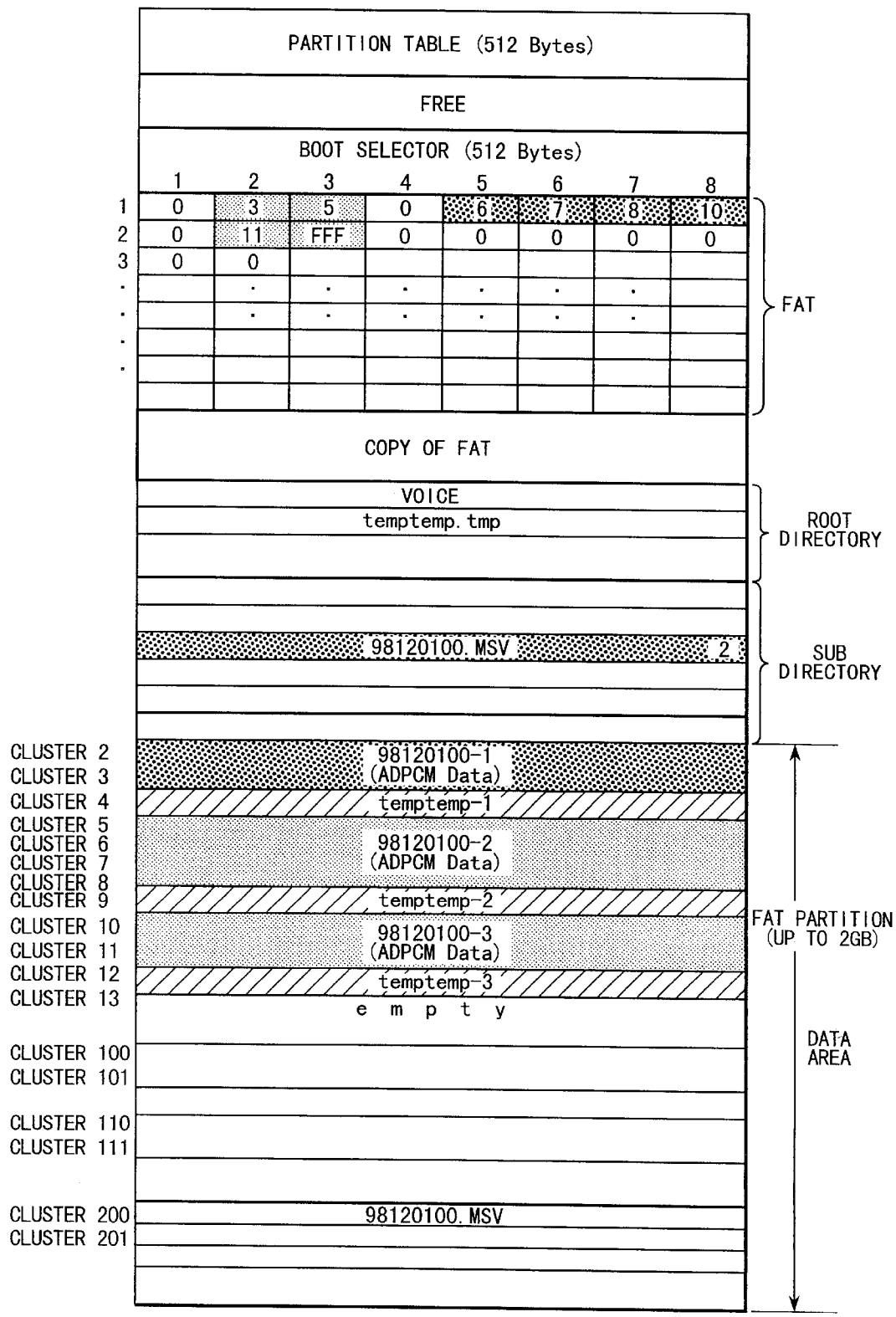
FIG. 30 is the fourth diagram illustrating directory structure change in high speed process of the present embodiment.

FIG. 30 indicates the state of input stream data termination. Finally inputted stream data items are in quantity of data corresponding to three clusters. The data at the writing-done third cluster is tentatively called "temptemp-3", but the name is not managed by the file management system. Neither are temptemp-1 and temptemp-2.

It is necessary to register stream data written before and at this time in the file system as substantial files. This is described with reference to FIG. 31. During FAT updating in step F105 shown in FIG. 16, FAT is scanned to find the smallest cluster number corresponding to the cluster in which 0 indicating a free cluster is written as an address. In this example, 0 is written in the part corresponding to cluster 4. In other words, the cluster 4 becomes the head of newly recorded stream data items. Further, the smaller cluster number after next is found from among next free clusters. In this example, cluster 9 is found, and so 9 is written in the location at cluster 4 on the FAT wherein 9 indicates that data to be reproduced next is one at cluster 9. Next, data at cluster 9 is read, and then it is determined that data is written. Therefore, the smaller cluster number is further found from among next free clusters. In this example, cluster 12 is found and the cluster 12 is not free, and so 12 is written in the location at cluster 9 on the FAT, wherein 12 indicates that data to be reproduced next is one at cluster 12. Further, when FAT is searched for a free cluster of the next smaller cluster number, it is found to be cluster 13. However, stream data is not written at cluster 13 and cluster 13 is found to be in the data-erased state by reading the cluster 13. Therefore, FFF is written in the location indicating the cluster 12 on FAT wherein FFF indicates that the cluster 12 is the last cluster at which stream data is newly recorded. Thereby, 9 is written in location 4 on FAT, 12 in location 9, FFF in location 12, which shows that the link of discretely written stream data is created.

Figure 31:
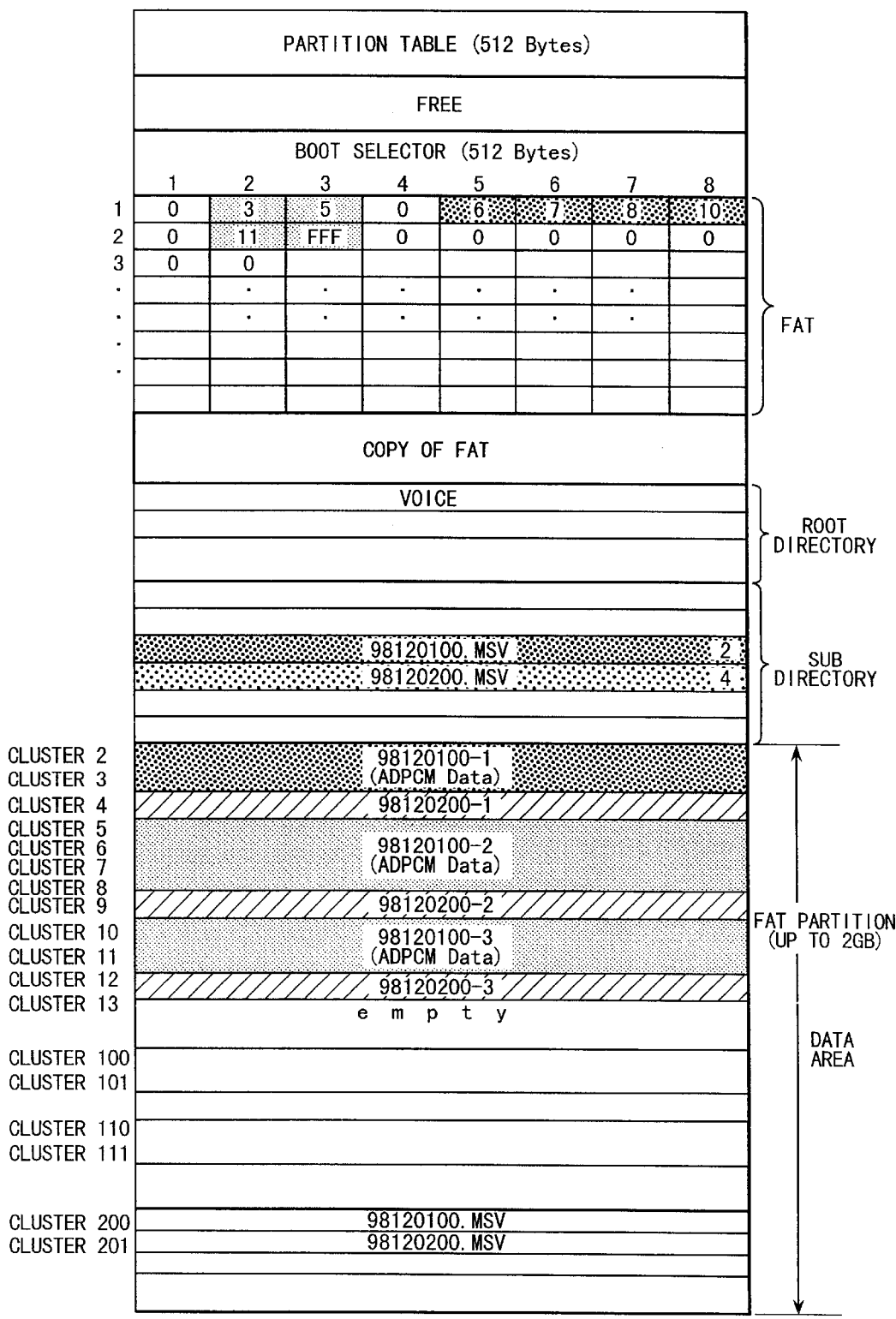
FIG. 31 is the fifth diagram illustrating directory structure change in high speed process of the present embodiment.

On updating a directory entry next, the file size 0 of a file tentatively called temptemp.tmp is changed to the value corresponding to the written stream data, and the file name is changed to 98120200.MSV like the example in FIG. 31 and recorded in a subdirectory area. During the updating of the name, the first cluster number of 98120200.MSV is updated to 4. In short, file size updating and change in file name with change in directory are carried out. In addition, 98120200.MSV is written at cluster 201 so that the file name 98120200.MSV is identified by the file system. During this process, a file called temptemp.tmp in the process of high speed marking in step F101 is erased at the same time.

Figure 26:
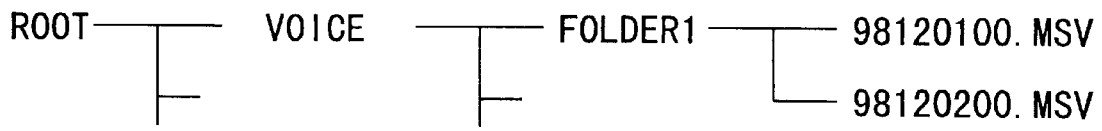
FIG. 26 is the third diagram illustrating directory change in high speed process of the present embodiment.

This state is shown in FIG. 26. A file called temptemp.tmp at the same level as that of a subdirectory called VOICE immediately under a root directory in FIG. 25 is changed in its name and directory. Then, as shown in FIG. 26, the file system identifies newly recorded stream data called 98120200.MSV at the same level as that of data called 98120100.MSV under a subdirectory FOLDER1 under a subdirectory called VOICE under a root directory. Thereby, a file called temptemp.tmp immediately under the root directory is erased from the file system.

In this example, the file name of newly recorded stream data is 98120200.MSV, but the apparatus may assign any file name or the user may input a file name before the beginning of recording or after the end of recording.

As understood from the above-mentioned description, in the high speed writing process of the present example, the stream data is written continuously in cluster unit and FAT is updated after the stream data is written completely.

As described herein above, in the address conversion table of the present example, the correspondent relation between the unused logical address and unused physical address is recorded previously.

Therefore, FAT and the address conversion table are not updated during the time period while the stream data is being recorded continuously. As the result, the writable data quantity per unit time is significantly increased in recording of the stream data in comparison with the conventional process described in FIG. 22. It is possible to increase the writable data quantity per unit time up to the approximately upper limit of the hardware.

As the result, the high bit rate stream data becomes accommodable. It is possible to record not only the voice data and audio data but also the moving picture data, which contains much data, sufficiently and in real time.

Furthermore, the data writing speed is significantly increased substantially, the access for updating FAT is performed only once, that is, the time required to update FAT is significantly reduced, and the power consumption for recording operation is significantly reduced.

The accommodation to the real time writing of the high bit rate stream data enables us to eliminate the buffer memory having a large capacity and the system processing, for example, controlling of the output timing of the stream data from the supply apparatus side when the audio data or moving picture data supplied from other apparatus is recorded, and thus the structure of not only the hardware namely the driving apparatus but also the software is simplified.

6. Resuming Process

It is possible to write, for example, the high bit rate stream data in real time by means of the above-mentioned high speed writing process, wherein, as understood from the description of the above-mentioned process, FAT is updated after the stream data is written completely, and the written stream data becomes effective, that is, becomes reproducible data only after updating of FAT is completed. In the event that updating of FAT becomes impossible due to shutdown of the power source, for example, power supply failure or other problems before FAT is updated, for example, at the time point during writing of the stream data or when the writing is completed, the written stream data becomes a null file namely unreproducible file because it is not managed by FAT.

In the case that the stream data can not be taken in again, for example, in the case that the stream data is, for example, the data dubbed from another recording medium, the purpose is achieved by dubbing the recording medium again. However, in the case that the stream data is the data obtained by recording the voice collected from the microphone 103 or the data obtained by recording the moving picture data collected from an imaging apparatus, or further for example, in the case that the stream data is the data obtained by recording broadcast voice received and demodulated by use of a radio receiver, the problem is very serious.

To avoid such problem, the present example is structured so that the data once written in the stick memory 1 can be resumed as effective data by performing resuming process in the event that updating of FAT becomes impossible.

Figure 21:
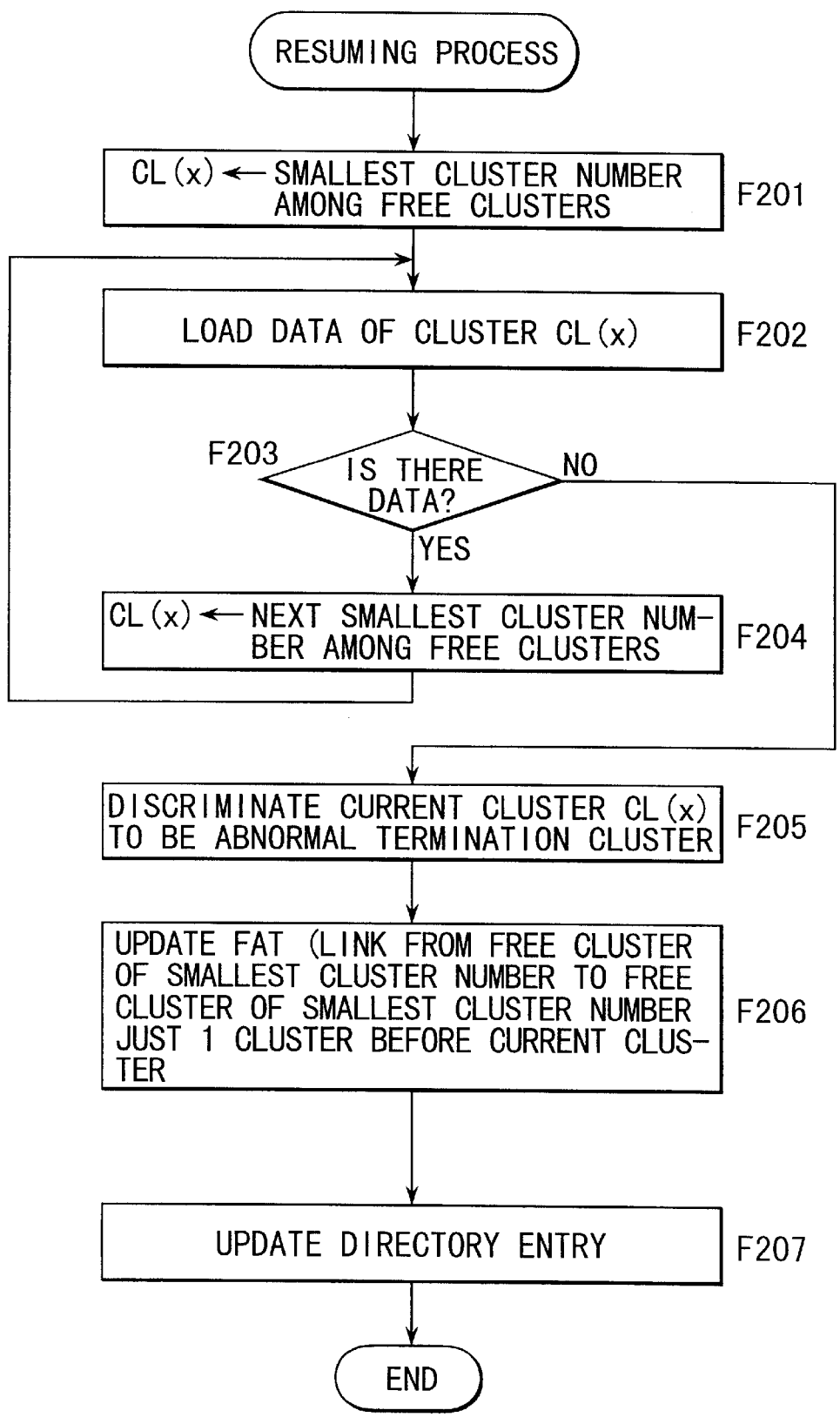
FIG. 21 is a flowchart of resuming process of the present embodiment.

The microcomputer 109 performs the process shown FIG. 21 as the resuming process, wherein the process shown in FIG. 17 is performed during writing to realize the resuming process.

In detail, during writing operation in cluster unit as described herein above, according to the writing rule, the stream data is written in the block of the cluster number at the smallest logical address among free clusters at every time point, and the data of two blocks of the next smallest and second next smallest cluster number is erased.

The resuming process shown in FIG. 21 is realized based on the above-mentioned process.

In the resuming processing, first the cluster number at the smallest logical address at that time point among unused clusters (free clusters) managed by FAT is set to the variable CL(x). The resuming process is performed for writing operation as described with reference to FIGS. 18A and 18B, 19, and 20 only when, for example, the file F2 has been recorded in the stick memory 1 as shown in FIG. 18B and FAT remains not updated yet as shown in FIG. 19.

Accordingly, the cluster that is judged to be the smallest cluster number in step F201 is actually the cluster number in which the first cluster of the file F2 has been written. In detail, the cluster of the smallest cluster number is the cluster CL(5) in the case shown in FIG. 18B and FIG. 19.

The data is read out from the cluster that is to be the cluster number CL(x) in step F202, and in step F203 whether there is a real data or not, namely whether this is a block from which the data has been erased or not, is determined.

In the case of the above-mentioned example, because the data is not recorded in the cluster CL(5), the sequence proceeds to step F204.

In step F204, the next smallest cluster number among free clusters in the FAT in the status shown in FIG. 19 is set to the variable CL(x). Then, the process of steps F202 and F203 is performed. In other words, reading of the block of the cluster number CL(x) and the existence of the data are checked similarly. In the case of the above-mentioned example, reading and the existence of the data are checked on the cluster CL(7) that is the next smallest cluster number to the cluster CL(5).

Because the data has been recorded in the cluster CL(7), the sequence proceeds to step F204.

Through the process in steps F201 to F204 as described herein above, the last block where the data is recorded is detected.

In detail, in the case of the above-mentioned example, reading and the existence of the data are checked on free clusters in the order of the number from the smallest, namely, from cluster CL(5), CL(7), CL(A), CL(B), CL(C), CL(D), to CL(E). In this process, the data existence is checked up to the cluster CL(E), then the sequence proceeds to step F104, and in step F204, the cluster CL(F) is set as the variable CL(x), and in steps F202 and F203, reading and data existence are checked.

At that time, because the data in the next and the second next blocks to which the stream data has been written is erased in the above-mentioned writing process, the blocks are judged to be no data blocks.

Accordingly, the existence of the data to be made effective in clusters CL(5), CL(7), CL(A), CL(B), CL(C), CL(D), and CL(E) is confirmed, and in step F205, CL(F) as the current cluster CL(x) is judged to be the cluster that is associated with abnormal termination.

In steps F206 and F207, the clusters CL(5), CL(7), CL(A), CL(B), CL(C), CL(D), and CL(E) which are judged to be made effective are linked on FAT, and the directory entry is updated so that the file is made effective.

As the result, FAT is updated as shown in FIG. 20, that is, the file F2 is resumed as an effective file.

Even in the case that FAT is updated collectedly after the stream data is recorded as the high speed writing process, the high speed writing process is rendered accommodative to the problem due to shutdown of power source by means of the above-mentioned resuming process.

In other words, though non-updated FAT status could occur on the written stream data in the above-mentioned high speed writing process, the non-updated FAT status is swept by performing the resuming process even if non-updated FAT status occurs, and the problem is solved.

In the case that updating of FAT becomes impossible after the whole stream data has been written completely as the file F2, the entire file F2 is resumed by means of the resuming process, and in the case that updating of FAT is interrupted due to, for example, shutdown of power source in the middle of writing of the stream data, of course the written portion of the stream data is the target of the resuming process.

For example, in the case of the file F2 shown in FIG. 18B, if the operation becomes impossible when the clusters CL(5), CL(7), CL(A), and CL(B) are written, because the cluster CL(C) is judged to be no data cluster, that is, erased status in the process in steps F201 to F204, FAT is updated so that the clusters CL(5), CL(7), CL(A), and CL(B) forms one linked file in the updating process in steps F206 and F207.

The above-mentioned resuming process may be started by means of user operation, or the microcomputer 109 may detect the non-updated status of FAT automatically and performs the resuming process.

For example, if the resuming process is performed immediately after the microcomputer 109 detects non-proper file closing, for example, abnormality that the high speed marking is not turned off in the stick memory 1 at the time point when the power source is resumed, then a user simply recognizes that the written portion of the stream data is effective without recognition of effectiveness or ineffectiveness of the file depending on FAT updating status.

The embodiment is described herein above, but the present invention is by no means limited to these structure and operation. Particularly, detailed procedures of the high speed writing process and the resuming process may be modified variously.

For example, in high speed writing process, the method of whether an erasing-finished cluster is detected is selected as a decision of whether last writing is completed in a cluster. On the other hand, a microcomputer 109 stores a cluster number at the end of the record at the time when writing of stream data is finished, and by collating the cluster number with the last cluster number stored by the microcomputer 109 at the process of creating a link for clusters, the last cluster in the link can easily be distinguished. To simplify the process of linking the clusters recorded after the end of recording, cluster address 4 may be recorded as part of associated information on temptemp.tmp which shows that the recording start position of stream data is being written just like the fact that cluster address 2 is stored as the start position of 98120100.MSV written in the subdirectory shown in FIG. 28. Doing so makes it unnecessary to refer to the FAT area and check the recording start position during the creation of link data. In addition, when the FAT area is referred to, it is possible to know that the recording start position is correct. Further, in order to simplify the process of linking the clusters recorded after the end of recording, only cluster numbers are recorded, for example, in RAM 111 in the drive apparatus so as to make it possible to distinguish the recording order whenever stream data is stored in stick memory 1, and the reading of the FAT formed on the stick memory 1 and the process of determining whether data is already written in an erasing-finished cluster can be omitted when the link is created based on the cluster numbers stored in the RAM 111 during linking of the recorded clusters. This normally terminates recording, and enables link processing of clusters for stream data newly recorded at higher speed when FAT updating is carried out.

The system of the present invention is by no means limited to the stick memory as shown in FIGS. 1A to 1D, and solid memory media having different apparent configuration like memory chips, memory cards, memory modules, etc. may be used.

The detailed specification of the format of the file system described hereinbefore may be changed depending on the actual conditions.

Furthermore, the variation of the flash memory capacity is by no means limited to that shown in FIG. 9. Of course, the memory element of the recording medium of the present invention is by no means limited to the flash memory, and other types of memory elements may be used.

As understood from the above-mentioned description, in the present invention, the main data recording operation in which the supplied main data such as the stream data is recorded continuously in the main data area is performed, and the address conversion information recording operation in which the correspondent relation between the logical address and the physical address is set including the unused physical address and logical address to generate or update the address conversion information and recorded in the recording medium is performed at least before execution of the main data recording operation. Furthermore, the management data updating operation in which the management data is updated correspondingly to the main data recording operation and the updated management data is recorded in the recording medium is performed after the main data recording operation.

Thereby, the management data and the address conversion information are not updated during the time period while the main data such as stream data is continuously being recorded, and the writable data quantity per unit time in recording the main data is therefore increased significantly. The writable data quantity per unit time is increased up to the approximately upper limit defined by the specification of the hardware.

As the result, the system is accommodable to the high bit rate stream data, this is an effect of the present invention.

Furthermore, the present invention provides another effect that the data writing speed is substantially increased significantly, and number of access repetition for updating the management data and the address conversion information is significantly reduced, and the power consumption for recording operation is significantly reduced resultantly.

In the present invention, in the case that the management data updating operation becomes impossible to be executed after interruption or completion of the main data recording operation, the logical address and the physical address used for main data recording operation are discriminated, the management data is updated depending on the discrimination result, and the updated management data is recorded in a recording medium to thereby perform the recorded data resuming operation for making the main data that has been recorded until interruption or completion of the main data recording operation effective. Therefore, in spite of the system in which the management data is updated after the main data is written completely as described herein above, in the case that the management data updating becomes impossible due to, for example, unexpected shutdown of power source, the recorded data is protected. Thereby, the reliability of the system is improved.

What is claimed is:

1. A recording method for recording main data in a recording medium having
   a blocked recording area in which continuously inputted main data can be recorded discretely, and
   a management area to record management data having writing start locations in said recording area for said respective main data, link data to logically link said main data recorded discretely, and directory information to manage said main data, the method comprising the steps of:
   recording a temporary file name in said directory information when said main data is recorded;
   retrieving recordable blocks that exist in said recording medium in a predetermined order;
   recording said main data in order in the recordable blocks which are detected by said step of retrieving;
   generating link data;
   recording said generated link data and a writing start location in said management area after completely recording said main data in said recording area; and
   erasing said temporary file name.

2. The recording method as claimed in claim 1 wherein said step of retrieving includes retrieving said recordable blocks in ascending order of identification numbers which are added to the recordable blocks.

3. The recording method as claimed in claim 1 wherein the step of recording of main data in said recordable blocks is performed after identification numbers of said retrieved recordable blocks are converted to physical addresses.

4. The recording method as claimed in claim 1 further comprising the step of erasing the contents of the recordable blocks before completion of writing said main data in said recordable blocks.

5. The recording method as claimed in claim 1, further comprising the steps of:
   retrieving said recordable blocks in accordance with said management data;
   detecting said recordable blocks in which said main data has already been written among said recordable blocks retrieved in said step of retrieving;
   generating said link data by linking identification numbers, which are added to said recordable blocks in a predetermined order when said recordable blocks in which the main data has already been written are detected among said recordable blocks in said step of detecting; and
   recording the generated link data in said management area.

6. The recording method as claimed in claim 5 wherein before said step of generating said link data said recordable blocks in which said main data is written are detected in the steps of:
   retrieving the identification numbers of said recordable blocks in a predetermined order;
   deciding whether said main data has already been recorded in said retrieved recordable blocks and
   specifying finally data-written blocks just before deciding that said main data has not yet been recorded in the retrieved recordable blocks as a result of said step of deciding.

7. The recording method as claimed in claim 5, further comprising the step of:
   storing said identification number added to said recordable block in which said main data is finally recorded in order, wherein said recordable block in which said main data is finally recorded is specified as said stored identification number during said step of generating said link data.

8. The recording method as claimed in claim 5, further comprising the step of:
   storing said identification number added to said recordable block in which new main data is recorded first, wherein said identification number is specified as a first recordable block in which new main data is recorded when said link data is generated.

9. The recording method as claimed in claim 1 wherein an identification name for identifying newly recorded main data is recorded in said management area when said temporary file name is erased in said step of erasing.

10. A managing method for managing a recording medium having a blocked recording area in which continuously inputted main data is recorded discretely; and a management area for recording management data having respective writing start locations of said main data in said recording area, link data for logically linking said discretely recorded main data, and directory information for managing said main data, the method comprising the steps of:

deciding whether a temporary file name has already been written as said directory information in the management area;

retrieving recordable blocks in a predetermined order according to said recording management data when it is decided in said step of deciding that a temporary file name has already been written as said directory information in the in the management area;

detecting whether the main data had already been recorded in the recordable blocks which are retrieved in said step of retrieving in accordance with said recording management data;

generating a writing start location when it is detected that the main data had already been recorded in said recordable blocks which are retrieved in said step of retrieving in accordance with the recording management data;

generating link data for logically linking said main data recorded discretely in said blocked recording area in order when it is detected in said step of detecting that the main data had already been recorded in said recordable blocks retrieved in said step of retrieving in accordance with the recording management data;

recording said generated writing start location and said generated link data as management data in said management area; and erasing said temporary file name after recording the generated writing start location and the generated link data.

11. The managing method as claimed in claim 10 wherein said step of retrieving in a predetermined order is performed in ascending order of identification numbers which are added to the recordable blocks.

12. The managing method as claimed in claim 10 wherein for generating said link data identification numbers which are added to the recordable blocks are retrieved in a predetermined order, then the recordable block in which said main data is recorded is specified to be the recordable block just before detecting the recordable block in which main data is not written yet.

13. A recording apparatus for recording main data in a recording medium having a blocked recording area in which continuously inputted main data is recorded discretely and a management area for recording management data having respective writing start locations of said main data in said recording area, link data for logically linking said discretely recorded main data, and directory information for managing said main data, the apparatus comprising:

recording and erasing means for performing one of recording and erasing said directory information, said main data, and said management data in or from respective specified areas of said recording medium;

retrieving means for retrieving recordable blocks in said recording medium in a predetermined order;

link data generating means for generating link data; and control means for controlling said recording and erasing means to record a temporary file name in said management area of said recording medium when the main data is recorded, to record in order the main data which is inputted in the recordable blocks retrieved by said retrieving means in said recording medium, to record the link data generated by said link data generating means and to write start locations in the management area of said recording medium after completion of recording all of said main data in said recording area, and to erase said temporary file name.

14. The recording apparatus as claimed in claim 13 wherein said retrieving means retrieves identification numbers which are added to the recordable blocks in ascending order.

15. The recording apparatus as claimed in claim 14, further comprising converting means for converting the identification numbers of said retrieved recordable blocks to physical addresses, wherein the main data is recorded in said recordable blocks according to result of address conversion by said converting means.

16. The recording apparatus as claimed in claim 13 wherein said control means controls said recording and erasing means to erase recorded contents of next recordable blocks to be recorded before completion of writing said main data in said recordable blocks.

17. The recording apparatus as claimed in claim 13 wherein said control means controls said retrieving means to retrieve the recordable blocks and to link identification numbers which are added to the recordable blocks among said recordable blocks retrieved by said retrieving means in a predetermined order of the identification numbers to generate said link data.

18. The recording apparatus as claimed in claim 13 wherein a last block in which main data is recorded among the recordable blocks which are retrieved by said retrieving means in a predetermined order is specified as the last block for continuously recording of said main data.

19. The recording apparatus as claimed in claim 13 wherein when said temporary file name is erased an identification file name to identify newly recorded main data is recorded in said management area.

20. The recording apparatus as claimed in claim 13 wherein said recording medium is removable from said recording apparatus.

21. The recording apparatus as claimed in claim 13 wherein said recording medium comprises a flash memory.

* * * * *